: (12) United States Patent
Kim et al.

(10) Patent No.: US 12,017,590 B2
(45) Date of Patent: Jun. 25, 2024

(54) DISPLAY PANEL AND VEHICLE INCLUDING THE DISPLAY PANEL

(71) Applicant: Samsung Display Co., Ltd., Yongin-si (KR)

(72) Inventors: Hyangyul Kim, Yongin-si (KR); Jaehong Kim, Yongin-si (KR); Hyunho Jung, Yongin-si (KR); Heeseong Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 141 days.

(21) Appl. No.: 17/553,782

(22) Filed: Dec. 16, 2021

(65) Prior Publication Data

US 2022/0306012 A1 Sep. 29, 2022

(30) Foreign Application Priority Data

Mar. 29, 2021 (KR) .......................... 10-2021-0040503

(51) Int. Cl.
*B60R 11/02* (2006.01)
*B60K 35/00* (2006.01)
(Continued)

(52) U.S. Cl.
CPC .......... *B60R 11/0235* (2013.01); *B60K 35/60* (2024.01); *G09G 3/3225* (2013.01);
(Continued)

(58) Field of Classification Search
CPC ............. B60R 11/0235; B60R 11/0229; B60R 2011/0005; B60K 37/02; B60K 2370/1526; B60K 2370/195; B60K 2370/25; B60K 2370/332; B60K 2370/91; B60K 35/00; B60K 2370/152; B60K 2370/654;
(Continued)

(56) References Cited

U.S. PATENT DOCUMENTS 8,213,082 B2 7/2012 Gaides et al.
8,503,122 B2 8/2013 Liu et al.
(Continued)

FOREIGN PATENT DOCUMENTS

JP 5520058 6/2014
JP 6421629 11/2018
(Continued)

*Primary Examiner* — Douglas M Wilson
(74) *Attorney, Agent, or Firm* — Lewis Roca Rothgerber Christie LLP

(57) ABSTRACT

A display panel includes: a substrate; a display element layer including a first organic light-emitting diode having a first emission area, a second organic light-emitting diode having a second emission area, and a third organic light-emitting diode having a third emission area, the first emission area having a long side extending in a first direction and a short side extending in a second direction intersecting the first direction; an encapsulation layer disposed on the display element layer; and a plurality of first light-blocking lines disposed on the encapsulation layer and extending in the first direction, the plurality of first light-blocking lines overlapping the first emission area, the second emission area, and the third emission area.

19 Claims, 15 Drawing Sheets

(51) Int. Cl.

| | |
|---|---|
| *B60K 35/22* | (2024.01) |
| *B60K 35/60* | (2024.01) |
| *G09G 3/3225* | (2016.01) |
| *H10K 50/844* | (2023.01) |
| *H10K 50/86* | (2023.01) |
| *H10K 59/12* | (2023.01) |
| *H10K 59/121* | (2023.01) |
| *H10K 59/122* | (2023.01) |
| *H10K 59/126* | (2023.01) |
| *H10K 59/35* | (2023.01) |
| *H10K 59/40* | (2023.01) |
| H10K 77/10 | (2023.01) |
| H10K 102/00 | (2023.01) |

(52) U.S. Cl.
CPC ........... *H10K 59/121* (2023.02); *H10K 59/40* (2023.02); *B60K 35/00* (2013.01); *B60K 35/22* (2024.01); *B60K 2360/1526* (2024.01); *B60K 2360/785* (2024.01); *G09G 2380/10* (2013.01); *H10K 50/8445* (2023.02); *H10K 50/865* (2023.02); *H10K 59/12* (2023.02); *H10K 59/122* (2023.02); *H10K 59/126* (2023.02); *H10K 59/35* (2023.02); *H10K 59/352* (2023.02); *H10K 77/111* (2023.02); *H10K 2102/302* (2023.02); *H10K 2102/3026* (2023.02); *H10K 2102/311* (2023.02)

(58) Field of Classification Search
CPC ........... B60K 2370/785; G09G 3/3225; G09G 2380/10; H10K 59/121; H10K 59/40; H10K 77/111; H10K 2102/311; H10K 50/8445; H10K 50/865; H10K 59/126; H10K 59/35; H10K 59/122; H10K 59/131; H10K 59/12; H10K 2102/302; H10K 59/352; H10K 2102/3026
See application file for complete search history.

(56) References Cited

U.S. PATENT DOCUMENTS

| | | |
|---|---|---|
| 9,063,284 B2 | 6/2015 | Jones et al. |
| 9,329,311 B2 | 5/2016 | Halverson et al. |
| 9,804,311 B2 | 10/2017 | Gaides et al. |
| 10,663,630 B2 | 5/2020 | Larsen et al. |
| 2004/0160657 A1 | 8/2004 | Tonar et al. |
| 2006/0109397 A1 | 5/2006 | Anandan |
| 2008/0073625 A1 | 3/2008 | Araya et al. |
| 2009/0165943 A1 | 7/2009 | Kim |
| 2014/0009704 A1 | 1/2014 | Pijlman et al. |
| 2015/0048347 A1* | 2/2015 | Tokuda ................ H10K 50/865 257/40 |
| 2017/0028924 A1 | 2/2017 | Baur et al. |
| 2017/0261793 A1 | 9/2017 | Son et al. |
| 2019/0235320 A1 | 8/2019 | Lin et al. |
| 2022/0024313 A1* | 1/2022 | Ahn ..................... B60K 35/213 |

FOREIGN PATENT DOCUMENTS

| | | |
|---|---|---|
| KR | 10-2007-0090654 | 9/2007 |
| KR | 10-2007-0090662 | 9/2007 |
| KR | 10-2010-0003849 | 1/2010 |
| KR | 10-2010-0091977 | 8/2010 |
| KR | 10-2010-0100952 | 9/2010 |
| KR | 10-2011-0064285 | 6/2011 |
| KR | 10-2011-0118152 | 10/2011 |
| KR | 10-2012-0030536 | 3/2012 |
| KR | 10-2014-0004505 | 1/2014 |
| KR | 10-2014-0041576 | 4/2014 |
| KR | 10-2016-0083609 | 7/2016 |
| KR | 10-2017-0023165 | 3/2017 |

\* cited by examiner

DISPLAY PANEL AND VEHICLE INCLUDING THE DISPLAY PANEL

CROSS-REFERENCE TO RELATED APPLICATION

This application claims priority from and the benefit of Korean Patent Application No. 10-2021-0040503, filed on Mar. 29, 2021, which is hereby incorporated by reference for all purposes as if fully set forth herein.

BACKGROUND

Field

Embodiments of the invention relate generally to a display panel and a vehicle including the display panel and more specifically, to a display panel for display an image in a specific direction and a vehicle including the display panel.

Discussion of the Background

In recent years, the usages of display devices have diversified. As the display devices have a thinner thickness and a lighter weight, the usage range of the display devices has widened, and as the display devices are used in various fields, the demand for the display devices capable of displaying high-quality images has been increased.

Recently, display devices have been provided inside vehicles to display images to a user sitting in a driver's seat or a passenger seat. Meanwhile, the light emitted from the display devices provided inside a vehicle may be reflected by a front window glass of the vehicle or a side window glass of the vehicle, and the user may recognize that the screen provided by the display device is formed on the front window glass or the side window glass. In this case, the driver's vision may be obstructed or disturbed while driving, and safety problems may occur while driving.

The above information disclosed in this Background section is only for understanding of the background of the inventive concepts, and, therefore, it may contain information that does not constitute prior art.

SUMMARY

Display panels constructed according to the principles of the invention are capable of emitting light in a specific direction.

Vehicles including display panels constructed according to the principles of the invention are capable of providing a safe driving by reducing or minimizing the reflection on a front window glass or side window glasses of the vehicles by using the display panel capable of emitting light in a specific direction.

Additional features of the inventive concepts will be set forth in the description which follows, and in part will be apparent from the description, or may be learned by practice of the inventive concepts.

According to an aspect of the invention, a display panel includes a substrate, a display element layer including a first organic light-emitting diode having a first emission area, a second organic light-emitting diode having a second emission area, and a third organic light-emitting diode having a third emission area, the first emission area having a long side extending in a first direction and a short side extending in a second direction intersecting the first direction, an encapsulation layer disposed on the display element layer, and a plurality of first light-blocking lines disposed on the encapsulation layer and extending in the first direction, the plurality of first light-blocking lines overlapping the first emission area, the second emission area, and the third emission area.

The plurality of first light-blocking lines may substantially divide each of the first emission area, the second emission area, and the third emission area into a same number of parts.

At least one of the plurality of first light-blocking lines may overlap an edge of one of the first emission area, the second emission area, and the third emission area.

Each of the second emission area and the third emission area may be disposed to be adjacent to the long side of the first emission area in the second direction, and the second emission area and the third emission area may be apart from each other in the first direction.

The encapsulation layer may include a first inorganic encapsulation layer covering the display element layer, an organic encapsulation layer disposed on the first inorganic encapsulation layer, and a second inorganic encapsulation layer disposed on the organic encapsulation layer, wherein the plurality of first light-blocking lines may be disposed on the second inorganic encapsulation layer.

The display panel may further include an organic layer disposed on the encapsulation layer, wherein the plurality of first light-blocking lines may include a plurality of lower light-blocking lines disposed between the encapsulation layer and the organic layer, and a plurality of upper light-blocking lines disposed on the organic layer and overlapping the plurality of lower light-blocking lines, respectively.

The first organic light-emitting diode may include a pixel electrode, an emission layer, and an opposite electrode, wherein a vertical distance from an upper surface of the emission layer to any one of the plurality of upper light-blocking lines may be greater than or equal to about 40 μm.

The first organic light-emitting diode may include a pixel electrode, an emission layer, and an opposite electrode, wherein a vertical distance from an upper surface of the emission layer to one of the plurality of upper light-blocking lines may be greater than or equal to twice a horizontal distance between adjacent upper light-blocking lines.

The plurality of first light-blocking lines may be a black matrix.

The display panel may further include a plurality of second light-blocking lines disposed on the encapsulation layer and extending in the second direction, the plurality of second light-blocking lines overlapping the first emission area, the second emission area, and the third emission area.

According to another aspect of the invention, a vehicle includes side window glasses facing each other, and a display panel disposed between the side window glasses, wherein the display panel includes a first sub-pixel having a long side extending in a first direction and a short side extending in a second direction intersecting the first direction, a second sub-pixel disposed on one side of the long side of the first sub-pixel, a third sub-pixel disposed to be adjacent to the long side of the first sub-pixel to be apart from the second sub-pixel, and a plurality of first light-blocking lines extending in the first direction and overlapping the first sub-pixel, the second sub-pixel, and the third sub-pixel, wherein one of the first direction and the second direction is substantially parallel to an imaginary straight line connecting the side window glasses.

The plurality of first light-blocking lines may divide each of the first sub-pixel, the second sub-pixel, and the third sub-pixel into a same number of parts.

One of the plurality of first light-blocking lines may overlap an edge of one of the first sub-pixel, the second sub-pixel, and the third sub-pixel.

The plurality of first light-blocking lines may be a black matrix.

The display panel may further include a plurality of second light-blocking lines extending in the second direction and overlapping the first sub-pixel, the second sub-pixel, and the third sub-pixel.

The display panel may further include a substrate, a display element layer disposed on the substrate and including a first organic light-emitting diode having a first emission area defining the first sub-pixel, a second organic light-emitting diode having a second emission area defining the second sub-pixel, and a third organic light-emitting diode having a third emission area defining the third sub-pixel, an encapsulation layer disposed on the display element layer, and an organic layer disposed on the encapsulation layer, wherein the plurality of first light-blocking lines may include a plurality of lower light-blocking lines disposed between the encapsulation layer and the organic layer, and a plurality of upper light-blocking lines disposed on the organic layer and overlapping the plurality of lower light-blocking lines, respectively.

The vehicle may further include a front window glass disposed between the side window glasses facing each other, wherein the display panel may be disposed under the front window glass.

The vehicle may further include a cluster, a center fascia, and a passenger seat dashboard spaced apart from the cluster by the center fascia therebetween, wherein the display panel may be disposed on at least one of the cluster, the center fascia, and the passenger seat dashboard.

The display panel may be disposed on the center fascia, and the first direction may be substantially parallel to an imaginary straight line connecting the side window glasses.

The display panel may be disposed on the passenger seat dashboard, and the second direction may be substantially parallel to an imaginary straight line connecting the side window glasses.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
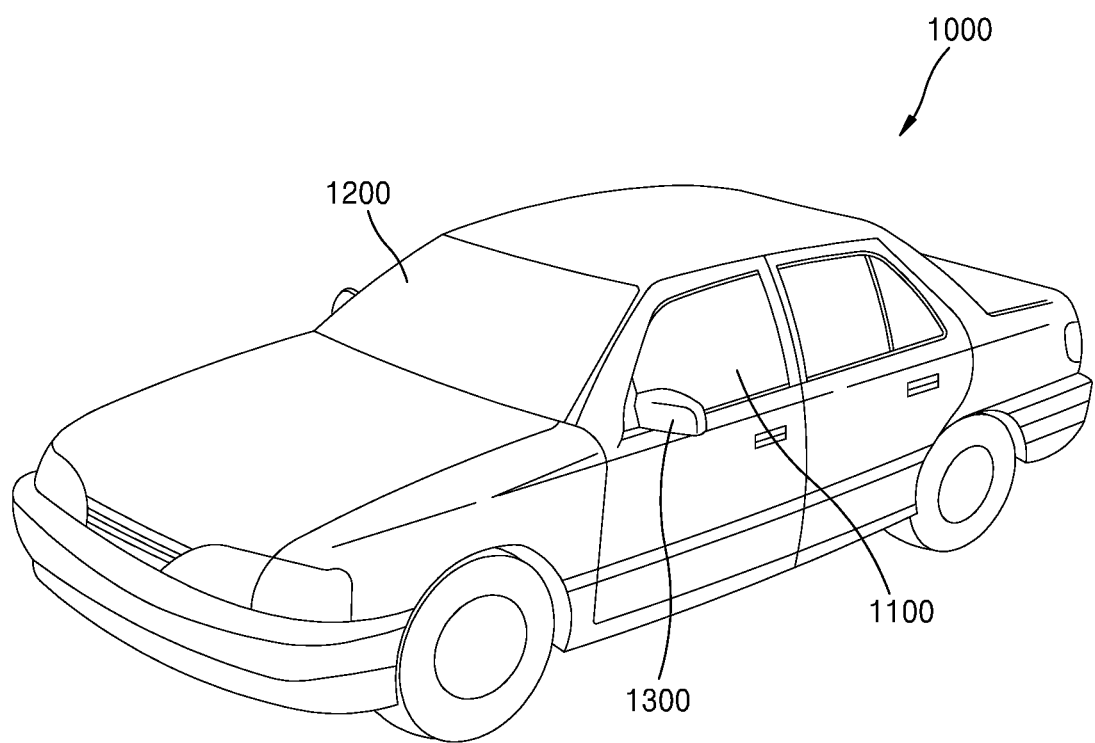
FIG. 1 is a perspective view of an embodiment of a vehicle constructed according to the principle of the invention illustrating the exterior of the vehicle.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
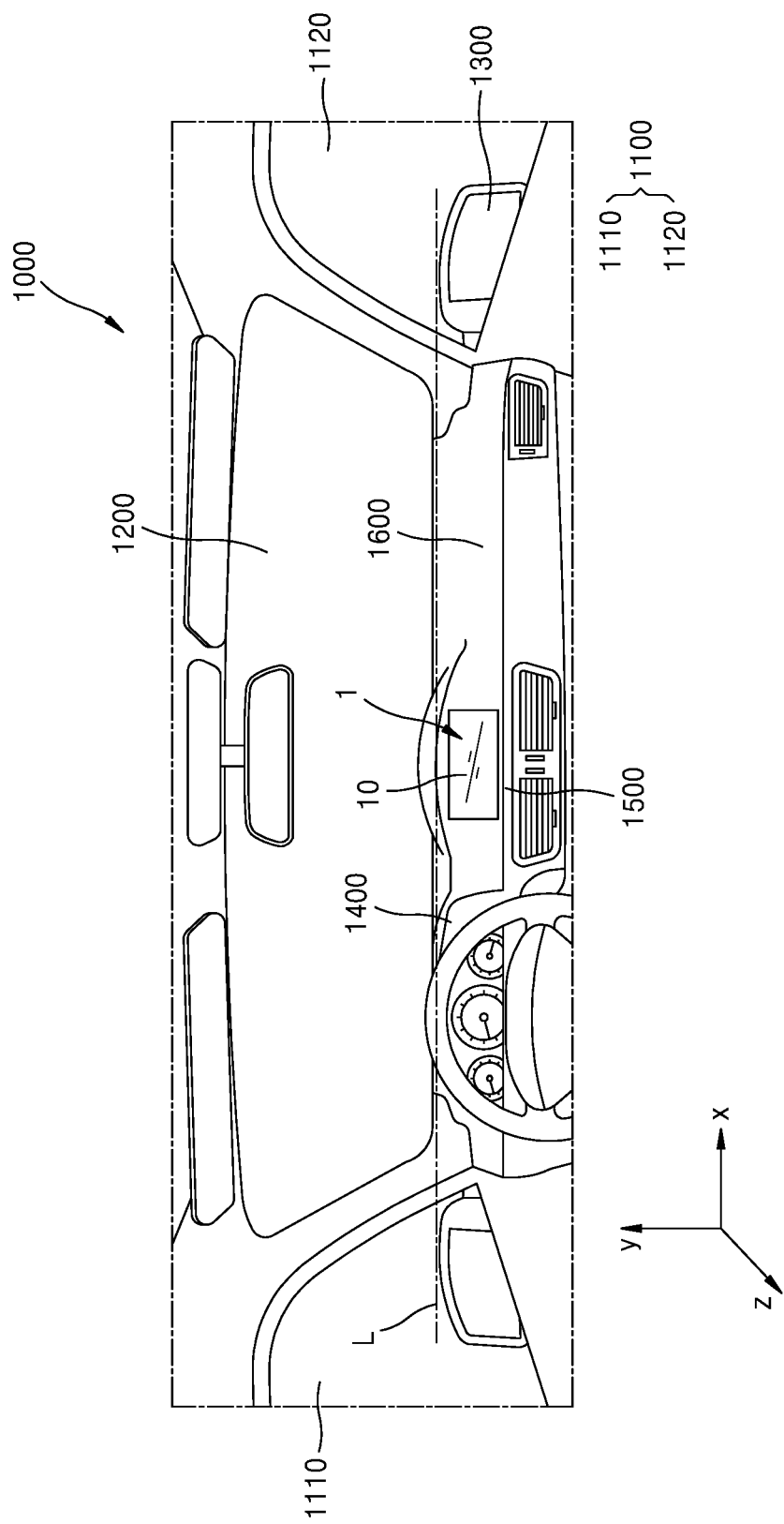
FIGS. 2A, 2B, and 2C are plan views of embodiments of the interior of the vehicle of FIG. 1.
Figure 2B:
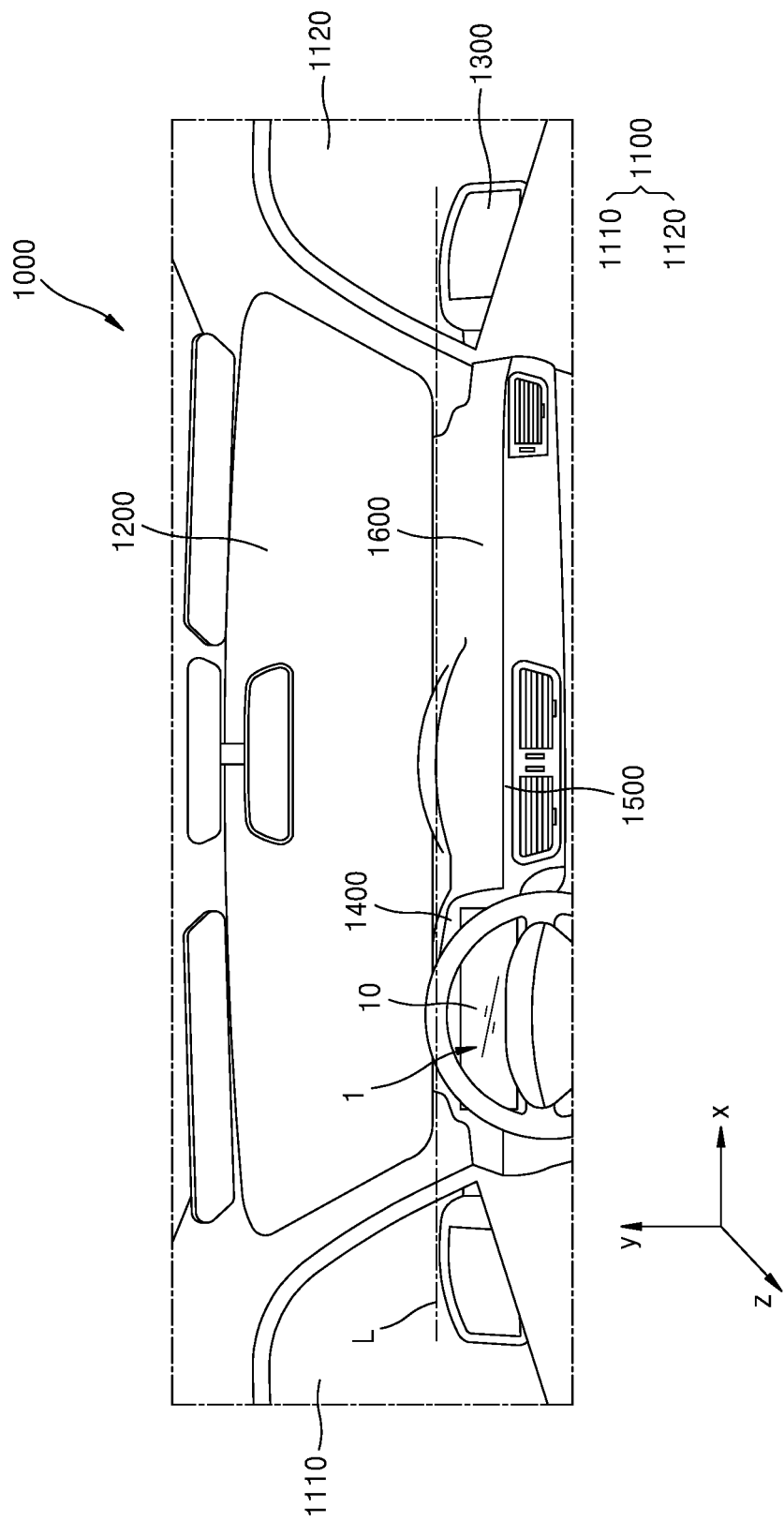
Figure 2C:
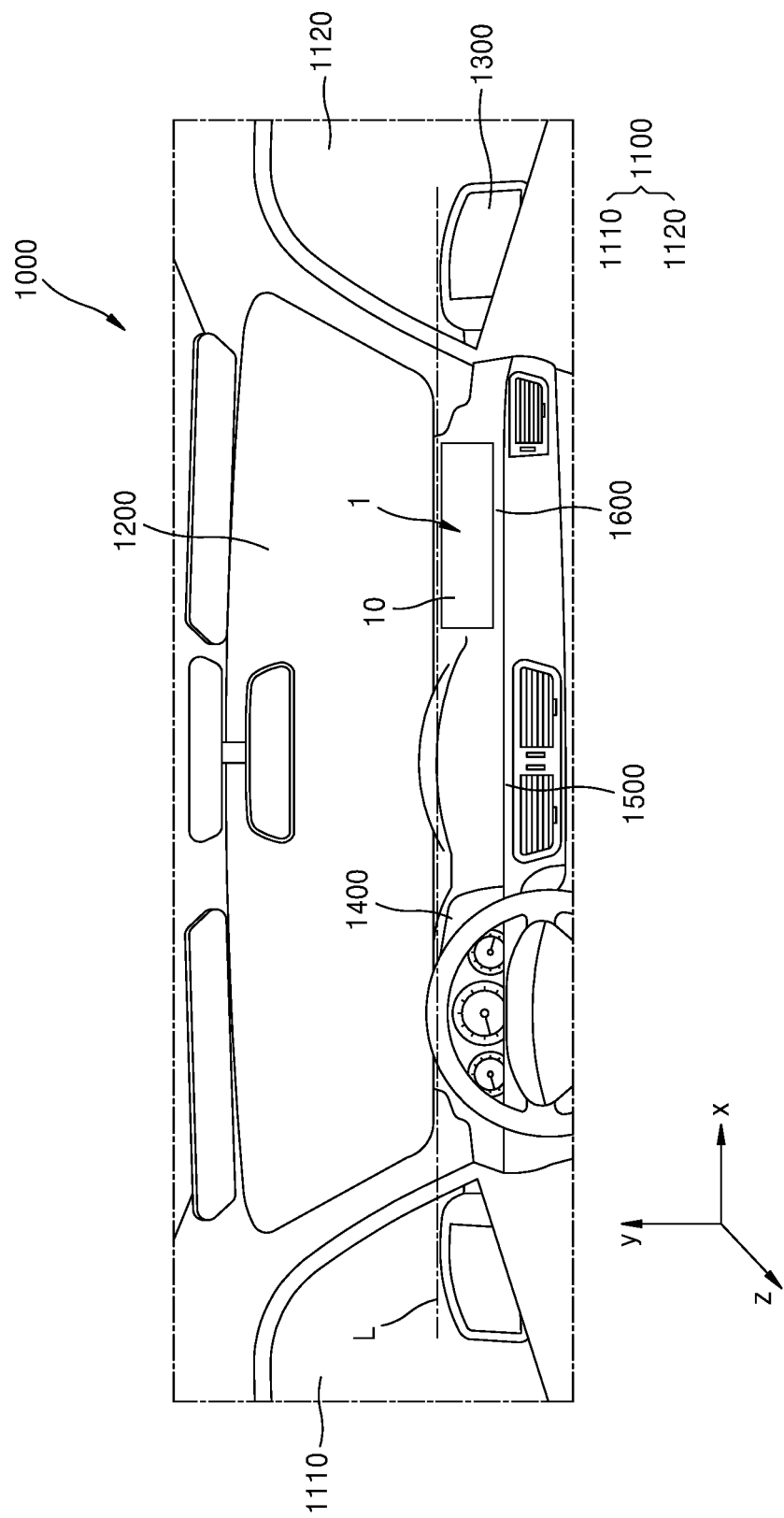

FIG. 1 is a schematic diagram illustrating the exterior of a vehicle 1000 according to an embodiment. FIGS. 2A, 2B, and 2C are schematic diagrams illustrating the interior of a vehicle 1000 according to other embodiments.

Referring to FIGS. 1, 2A, 2B, and 2C, the vehicle 1000 may refer to various devices for moving or transporting a target, e.g., a human, an object, or an animal, from the original location to the target location. The vehicle 1000 may include a vehicle traveling on a road or track, a vessel moving over the sea or river, and an airplane flying in the sky.

The vehicle 1000 may travel on a road or a track. The vehicle 1000 may move in a certain direction according to rotation of at least one wheel. For example, the vehicle 1000 may include a three-wheeled or four-wheeled vehicle, a construction machine, a two-wheeled vehicle, a motor device, a bicycle, and a train running on a track.

The vehicle 1000 may include a body having an interior and an exterior, and a chassis in which mechanical devices necessary for driving are installed as the remaining parts except for the body. The exterior of the body may include a pillar provided at a boundary between a front panel, a bonnet, a roof panel, a rear panel, a trunk, and a door. The chassis of the vehicle 1000 may include a power generating device, a power transmitting device, a driving device, a steering device, a braking device, a suspension device, a transmission device, a fuel device, left and right wheels at the front and rear, and the like.

The vehicle 1000 may include a side window glass 1100, a front window glass 1200, a side mirror 1300, a cluster 1400, a center fascia 1500, a passenger seat dashboard 1600, and a display device 1.

The side window glass 1100 and the front window glass 1200 may be partitioned by a pillar located between the side window glass 1100 and the front window glass 1200.

The side window glass 1100 may be installed on the side of the vehicle 1000. In an embodiment, the side window glass 1100 may be installed on a door of the vehicle 1000. A plurality of side window glasses 1100 may be provided and may face each other. In an embodiment, the side window glass 1100 may include a first side window glass 1110 and a second side window glass 1120. In an embodiment, the first side window glass 1110 may be located adjacent to the cluster 1400. The second side window glass 1120 may be located adjacent to the passenger seat dashboard 1600.

In an embodiment, the side window glasses 1100 may be apart from each other in a positive x-axis direction or a negative x-axis direction. For example, the first side window glass 1110 and the second side window glass 1120 may be apart from each other in the positive x-axis direction or the negative x-axis direction. In other words, an imaginary straight line L connecting the side window glasses 1100 may extend in the positive x-axis direction or the negative x-axis direction. For example, an imaginary straight line L connecting the first side window glass 1110 and the second side window glass 1120 to each other may extend in the positive x-axis direction or the negative x-axis direction.

The front window glass 1200 may be installed in front of the vehicle 1000. The front window glass 1200 may be located between the side window glasses 1100 facing each other.

The side mirror 1300 may provide a view of the rear of the vehicle 1000. The side mirror 1300 may be installed on the exterior of the body. In an embodiment, a plurality of side mirrors 1300 may be provided. One of the plurality of side mirrors 1300 may be located outside the first side window glass 1110. The other one of the plurality of side mirrors 1300 may be located outside the second side window glass 1120.

The cluster 1400 may be located in front of the steering wheel. The cluster 1400 may include a tachometer, a speedometer, a coolant thermometer, a fuel gauge indicator light, a high beam indicator light, a warning light, a seat belt warning light, a trochometer, an odometer, an automatic shift indicator light, a door open warning light, an engine oil warning light, and/or a low fuel warning light.

The center fascia 1500 may include a control panel on which a plurality of buttons for adjusting an audio device, an air conditioning device, and a heater of a seat are located. The center fascia 1500 may be located on one side of the cluster 1400.

The passenger seat dashboard 1600 may be apart from the cluster 1400 with the center fascia 1500 therebetween. In an embodiment, the cluster 1400 may be located to correspond to a driver's seat, and the passenger seat dashboard 1600 may be located to correspond to a passenger seat. In an embodiment, the cluster 1400 may be adjacent to the first side window glass 1110, and the passenger seat dashboard 1600 may be adjacent to the second side window glass 1120.

In an embodiment, the display device 1 may include a display panel 10, and the display panel 10 may display an image. The display device 1 may be located inside the vehicle 1000. In an embodiment, the display device 1 may be located between the side window glasses 1100 facing each other. The display device 1 may be located on at least one of the cluster 1400, the center fascia 1500, and the passenger seat dashboard 1600.

The display device 1 may include a liquid crystal display, an electrophoretic display, an organic light-emitting display, an inorganic electroluminescence (EL) display (e.g., an inorganic light-emitting display), a field emission display, a surface-conduction electron-emitter display, a quantum dot display, a plasma display, a cathode ray display, or the like. Hereinafter, as the display device 1 according to an embodiment, an organic light-emitting display device will be described as an example. However, various types of display devices as described above may be used in embodiments.

Referring to FIG. 2A, the display device 1 may be located on the center fascia 1500. In an embodiment, the display device 1 may display navigation information. In an embodiment, the display device 1 may display information about audio, video, or vehicle settings.

In an embodiment, light emitted from the display device 1 may travel in a certain direction. For example, the light emitted from the display device 1 may travel toward a driver's seat. The light emitted from the display device 1 may travel toward a passenger seat. The light emitted from the display device 1 may not travel to the front window glass 1200. Alternatively, the light emitted from the display device 1 may travel to the front window glass 1200 at a relatively small intensity. When the light emitted from the display device 1 travels toward the front window glass 1200, the light emitted from the display device 1 may be reflected by the front window glass 1200 to reach the driver's seat. Accordingly, the driver may recognize an image of the display device 1 provided on the front window glass 1200, and may not recognize an object in front of the vehicle, and thus may not be safe while driving. In an embodiment, the light emitted from the display device 1 located on the center fascia 1500 may travel in a certain direction. Accordingly, the light traveling toward the front window glass 1200 may be reduced.

Referring to FIG. 2B, the display device 1 may be located in the cluster 1400. In this case, the cluster 1400 may illustrate driving information and the like through the display device 1. For example, the cluster 1400 may be in the form of an automotive digital instrument cluster. The cluster 1400 may display vehicle information and driving information as images. For example, a needle and gauge of a tachometer and various warning light icons may be displayed in digital signals.

In an embodiment, the light emitted from the display device 1 may travel in a certain direction. For example, the light emitted from the display device 1 may travel toward a driver's seat. The light emitted from the display device 1 may not travel to the front window glass 1200. Alternatively, the light emitted from the display device 1 may travel to the front window glass 1200 at a relatively small intensity. When the light emitted from the display device 1 travels toward the front window glass 1200, the light emitted from the display device 1 may be reflected by the front window glass 1200 to reach the driver's seat. Accordingly, the driver may recognize an image of the display device 1 formed on the front window glass 1200, and may cause a safety problem while driving. In an embodiment, the light emitted from the display device 1 located in the cluster 1400 may travel in a certain direction. Accordingly, the light traveling toward the front window glass 1200 may be reduced.

For example, the light emitted from the display device 1 may not travel to the first side window glass 1110. Alternatively, the light emitted from the display device 1 may travel to the first side window glass 1110 at a relatively small intensity. When the light emitted from the display device 1 travels to the first side window glass 1110, the light emitted from the display device 1 may be reflected by the first side window glass 1110 to reach the driver's seat. Accordingly, the driver may recognize an image of the display device 1 provided on the first side window glass 1110, and may not clearly see the side mirror 1300 located on the outside of the first side window glass 1110 to thereby cause a safety problem while driving. In an embodiment, the light emitted from the display device 1 located in the cluster 1400 may travel in a certain direction. Accordingly, the light traveling toward the front window glass 1200 and/or the first side window glass 1110 may be reduced.

Referring to FIG. 2C, the display device 1 may be located on the passenger seat dashboard 1600. The display device 1 may be embedded in the passenger seat dashboard 1600 or located on the passenger seat dashboard 1600. In an embodiment, the display device 1 located on the passenger seat dashboard 1600 may display an image related to information displayed on the cluster 1400 and/or information displayed on the center fascia 1500. In another embodiment, the display device 1 located on the passenger seat dashboard

1600 may display information different from information displayed on the cluster 1400 and/or information displayed on the center fascia 1500.

In an embodiment, the light emitted from the display device 1 may travel in a certain direction. For example, the light emitted from the display device 1 may travel toward the passenger seat. As another example, the light emitted from the display device 1 may not travel toward the driver's seat. As another example, the light emitted from the display device 1 may not travel to the second side window glass 1120. Alternatively, the light emitted from the display device 1 may travel to the second side window glass 1120 at a relatively small intensity. When the light emitted from the display device 1 travels to the second side window glass 1120, the light emitted from the display device 1 may be reflected by the second side window glass 1120 to reach the driver's seat. Accordingly, the driver may recognize an image of the display device 1 provided on the second side window glass 1120, and may not clearly see the side mirror 1300 located on the outside of the second side window glass 1120, to thereby cause a safety problem while driving. In an embodiment, the light emitted from the display device 1 located on the passenger seat dashboard 1600 may travel in a certain direction. Accordingly, the light traveling toward the second side window glass 1120 may be reduced.

In some embodiments, the light emitted from the display device 1 located on the passenger seat dashboard 1600 may not travel to the front window glass 1200. Accordingly, a front driving view of the driver may not be obstructed or disturbed from the display device 1 located on the passenger seat dashboard 1600.

Figure 3:
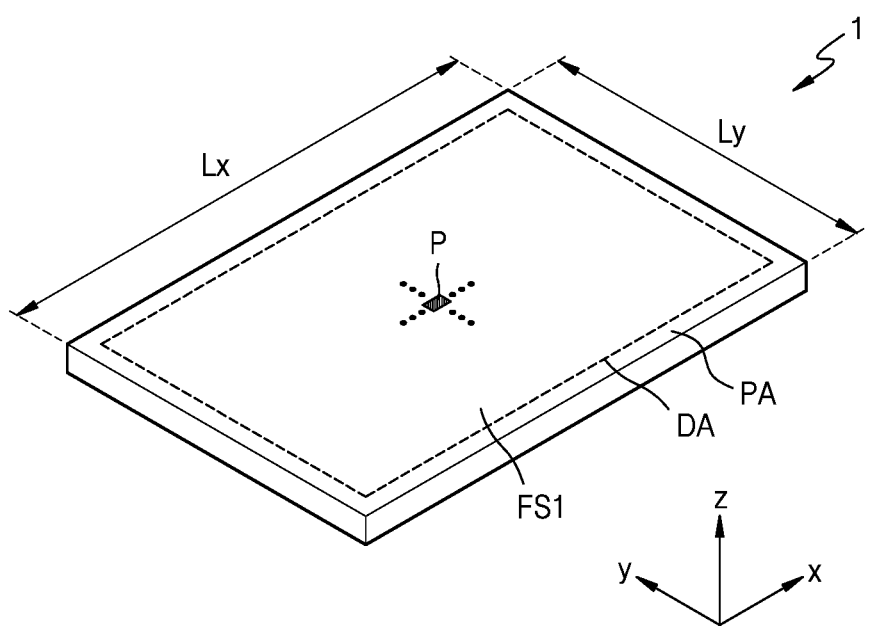
FIG. 3 is a perspective view of a display device of the vehicle of FIG. 1.

FIG. 3 is a schematic perspective view illustrating a display device 1 according to an embodiment.

Referring to FIG. 3, the display device 1 may include a display area DA and a peripheral area PA. A sub-pixel P may be located in the display area DA. In an embodiment, the sub-pixel P may be located on a front surface FS1 of the display device 1.

In an embodiment, a plurality of sub-pixels P may be located in the display area DA. The sub-pixels P may be implemented as a display element. The display device 1 may provide an image using light emitted from the sub-pixels P. The light emitted from the sub-pixels P may travel in a certain direction from the front surface FS1 of the display device 1. The light emitted from the sub-pixels P may not travel in a certain other direction from the front surface FS1 of the display device 1. In an embodiment, the light emitted from the sub-pixels P may travel in a direction (e.g., a z-axis direction) perpendicular to the front surface FS1 of the display device 1. The light emitted from the sub-pixels P may travel in a direction (e.g., in a direction intersecting the z-axis direction) oblique to the front surface FS1 of the display device 1. The light emitted from the sub-pixels P may not have a component in at least one of a x-axis direction and a y-axis direction.

In an embodiment, the sub-pixels P may emit red, green, or blue light by using a display element. In an embodiment, the sub-pixels P may emit red, green, blue, or white light by using a display element. In an embodiment, the sub-pixels P may be defined as an emission area of a display element that emits light of any one color among red, green, blue, and white.

In an embodiment, the sub-pixels P may include a light-emitting diode as a display element capable of emitting light of a certain color. The light-emitting diode may include an organic light-emitting diode including an organic material as an emission layer. Alternatively, the light-emitting diode may include an inorganic light-emitting diode. Alternatively, the light-emitting diode may include quantum dots as the emission layer. In an embodiment, the size of the light-emitting diode may be in a micro scale or a nano scale. For example, the light-emitting diode may be a micro light-emitting diode. Alternatively, the light-emitting diode may be a nano light-emitting diode. The nano light-emitting diode may include gallium nitride (GaN). In an embodiment, a color conversion layer may be located on the nano light-emitting diode. The color conversion layer may include quantum dots. Hereinafter, for convenience of description, a case in which the light-emitting diode includes an organic light-emitting diode will be described in detail.

The peripheral area PA may be an area that does not provide an image. The peripheral area PA may at least partially surround the display area DA. In an embodiment, the peripheral area PA may entirely surround the display area DA. A driver for providing an electrical signal or power to the sub-pixels P may be located in the peripheral area PA. Also, the peripheral area PA may include a pad area in which a pad is located.

The display device 1 may have an edge. In an embodiment, the display device 1 may have at least one edge. For example, the display device 1 may have a polygonal shape. As another example, the display device 1 may have a circular shape or an elliptical shape. As another example, the edge of the display device 1 may have a curve. Hereinafter, a case in which the display device 1 has a rectangular shape will be described in detail.

The display device 1 may have a first edge Lx and a second edge Ly. The first edge Lx may be an edge of the display device 1 extending in the positive x-axis direction or the negative x-axis direction as shown in FIG. 3. The second edge Ly may be an edge of the display device 1 extending in the positive y-axis direction or negative y-axis direction as shown in FIG. 3. In an embodiment, the first edge Lx and the second edge Ly may have different lengths. For example, the first edge Lx may be longer than the second edge Ly. As another example, the first edge Lx may be shorter than the second edge Ly. In another embodiment, the first edge Lx and the second edge Ly may have the substantially same length.

Figure 4A:
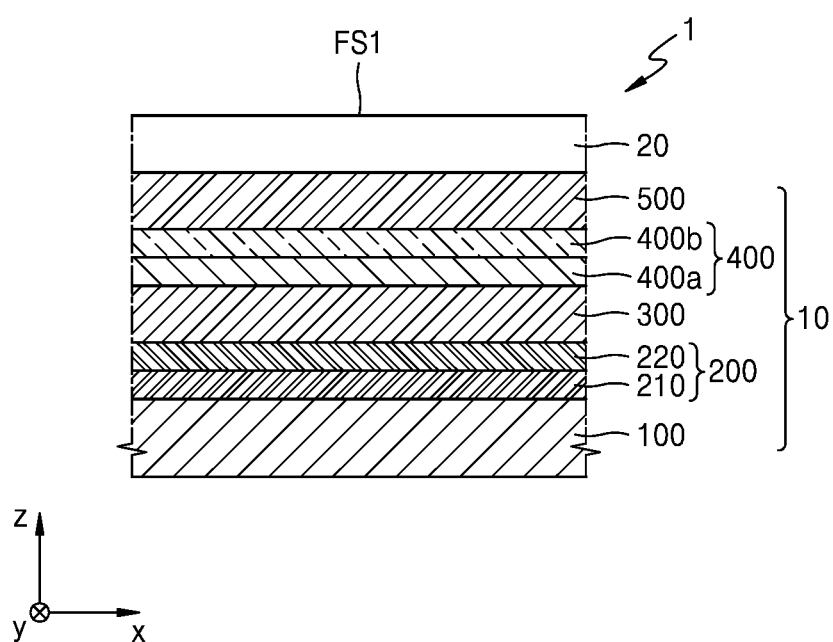
FIGS. 4A and 4B are cross-sectional views of embodiments of the display device of FIG. 3.
Figure 4B:
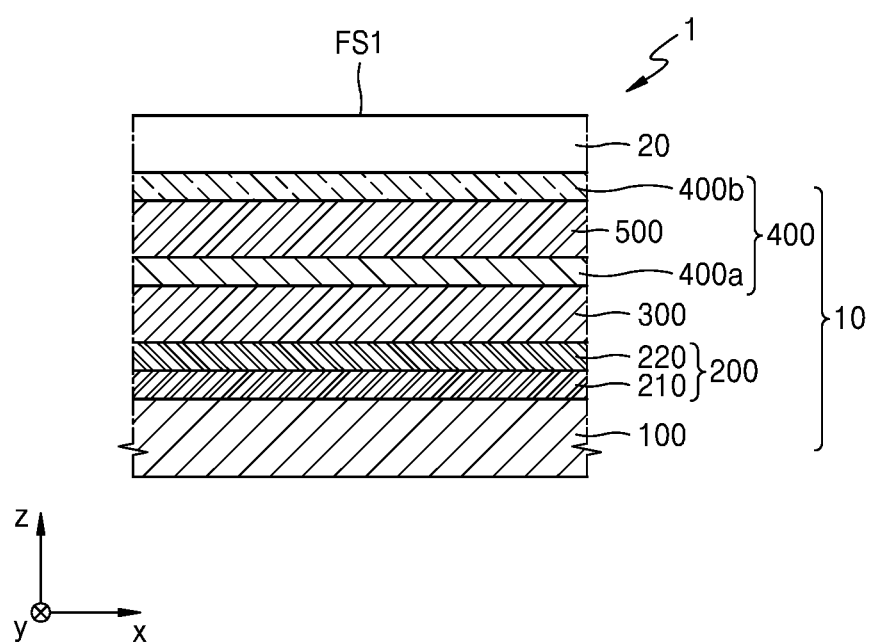

FIGS. 4A and 4B are schematic cross-sectional views illustrating a display device 1 according to an embodiment.

Referring to FIGS. 4A and 4B, the display device 1 may include a display panel 10 and a cover window 20. The display panel 10 may include a substrate 100, a display layer 200, an encapsulation layer 300, a functional layer 400, and an anti-reflection layer 500.

The substrate 100 may be glass or may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment, the substrate 100 may have a multilayer structure including a base layer including the aforementioned polymer resin and a barrier layer. The substrate 100 including the polymer resin may have flexible, rollable, and bendable properties.

The display layer 200 may be located on the substrate 100. The display layer 200 may include a pixel circuit layer 210 and a display element layer 220. The pixel circuit layer 210 may include pixel circuits. The display element layer 220 may include a plurality of display elements respectively connected to a plurality of pixel circuits. Each of the display elements included in the display element layer 220 may define a sub-pixel. The pixel circuit layer 210 may include a plurality of thin-film transistors and a plurality of storage capacitors.

The encapsulation layer 300 may be located on the display layer 200. In an embodiment, the encapsulation layer 300 may include at least one inorganic encapsulation layer and at least one organic encapsulation layer. The at least one inorganic encapsulation layer may include one or more inorganic materials selected from among aluminum oxide ($Al_2O_3$), titanium oxide ($TiO_2$), tantalum oxide ($Ta_2O_5$), zinc oxide (ZnO), silicon oxide ($SiO_2$), silicon nitride (SiNx), and silicon oxynitride (SiON). The at least one organic encapsulation layer may include a polymer-based material. The polymer-based material may include an acrylic resin, an epoxy-based resin, polyimide, polyethylene, or and the like. In an embodiment, the at least one organic encapsulation layer may include an acrylate.

In another embodiment, the encapsulation layer 300 may have a structure in which the substrate 100 and an upper substrate, which is a transparent member, are coupled to each other with a sealing member to seal an inner space between the substrate 100 and the upper substrate. In this case, a moisture absorbent or a filler may be located in the inner space. The sealing member may be in the form of a sealant, and in another embodiment, the sealing member may include a material that is cured by a laser. For example, the sealing member may be in the form of a frit. Specifically, the sealing member may include an organic sealant such as a urethane-based resin, an epoxy-based resin, or an acrylic resin, or an inorganic sealant such as silicone. For example, urethane acrylate or the like may be used as the urethane-type resin. For example, butyl acrylate, ethylhexyl acrylate, or the like may be used as the acrylic resin. The sealing member may include a material that is cured by heat.

The functional layer 400 may be located on the encapsulation layer 300. The functional layer 400 may include a first functional layer 400a and a second functional layer 400b. In an embodiment, at least one of the first functional layer 400a and the second functional layer 400b may include a touch sensor layer. The touch sensor layer may be a layer for sensing a user's touch input, and may sense the user's touch input by using at least one of various touch methods such as a resistive method or a capacitive method. In an embodiment, at least one of the first functional layer 400a and the second functional layer 400b may include an optical layer. In an embodiment, the optical layer may be a layer having a structure for controlling a direction of light emitted from display elements.

In an embodiment, the functional layer 400 may be provided such that some components of the touch sensor layer and some components of the optical layer are shared with each other. For example, the functional layer 400 may be a touch sensor layer capable of sensing a touch input and an optical layer capable of improving optical performance.

Referring to FIG. 4A, the anti-reflection layer 500 may be located on the functional layer 400. The anti-reflection layer 500 may reduce the reflectance of light (e.g., external light) incident from the outside toward the display panel 10.

In an embodiment, the anti-reflection layer 500 may be provided in the form of a polarizing film. The polarizing film may include a linear polarizing plate and a retardation film such as a λ/4 plate (i.e., quarter-wave plate). The retardation film may be located on the functional layer 400, and the linear polarizing plate may be located on the retardation film.

In an embodiment, the anti-reflection layer 500 may include a light-blocking layer and/or a filter layer including color filters. The color filters may be arranged according to the color of the light emitted from each of the sub-pixels of the display panel 10. For example, the filter layer may include a red, green, or blue color filter.

In an embodiment, when the anti-reflection layer 500 includes a light-blocking layer and/or color filters, the anti-reflection layer 500 may be placed between a first functional layer 400a and a second functional layer 400b, as shown in FIG. 4B. In this case, the configuration of the anti-reflection layer 500 and the configuration of the optical layer may be at least partially shared with each other.

The cover window 20 may be located on the display panel 10. In an embodiment, the cover window 20 may be coupled to at least one of components thereunder, for example, the anti-reflection layer 500 and the functional layer 400, through an adhesive such as an optically clear adhesive (OCA). The cover window 20 may protect the display panel 10. The cover window 20 may include at least one of glass, sapphire, and plastic. The cover window 20 may include, for example, ultra-thin glass (UTG) or colorless polyimide (CPI).

Figure 5:
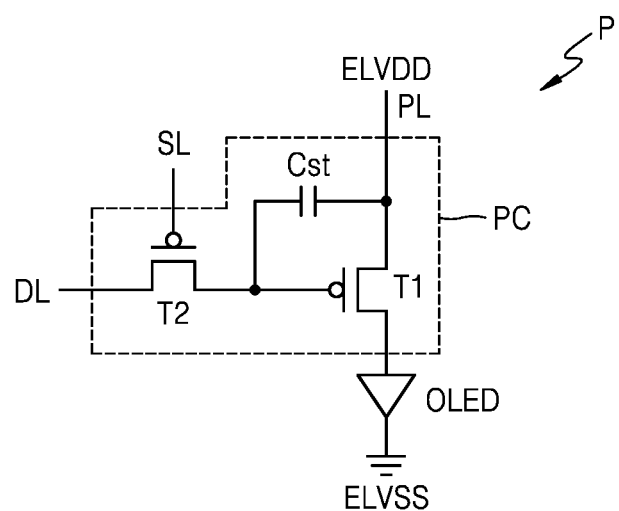
FIG. 5 is an equivalent circuit diagram of a representative sub-pixel of the display device of FIG. 3.

FIG. 5 is an equivalent circuit diagram of a sub-pixel P according to an embodiment.

Referring to FIG. 5, the sub-pixel P may include a pixel circuit PC and an organic light-emitting diode OLED as a display element.

The pixel circuit PC may include a driving thin-film transistor T1, a switching thin-film transistor T2, and a storage capacitor Cst. The sub-pixel P may emit, for example, red, green, or blue light, or red, green, blue, or white light through the organic light-emitting diode LED.

The switching thin-film transistor T2 may be connected to a scan line SL, and may transfer, to the driving thin-film transistor T1, a data signal or data voltage inputted from a data line DL based on a scan signal or switching voltage inputted from a scan line SL. The storage capacitor Cst may be connected to the switching thin-film transistor T2 and a driving voltage line PL, and may store a voltage corresponding to a difference between a voltage received from the switching thin-film transistor T2 and a first power voltage ELVDD supplied to the driving voltage line PL.

The driving thin-film transistor T1 may be connected to the driving voltage line PL and the storage capacitor Cst, and may control a driving current flowing through the organic light-emitting diode OLED from the driving voltage line PL in response to a voltage value stored in the storage capacitor Cst. The organic light-emitting diode OLED may emit light having a certain luminance by the driving current. A common electrode (e.g., a cathode) of the organic light-emitting diode OLED may receive a second power voltage ELVSS.

Figure 6:
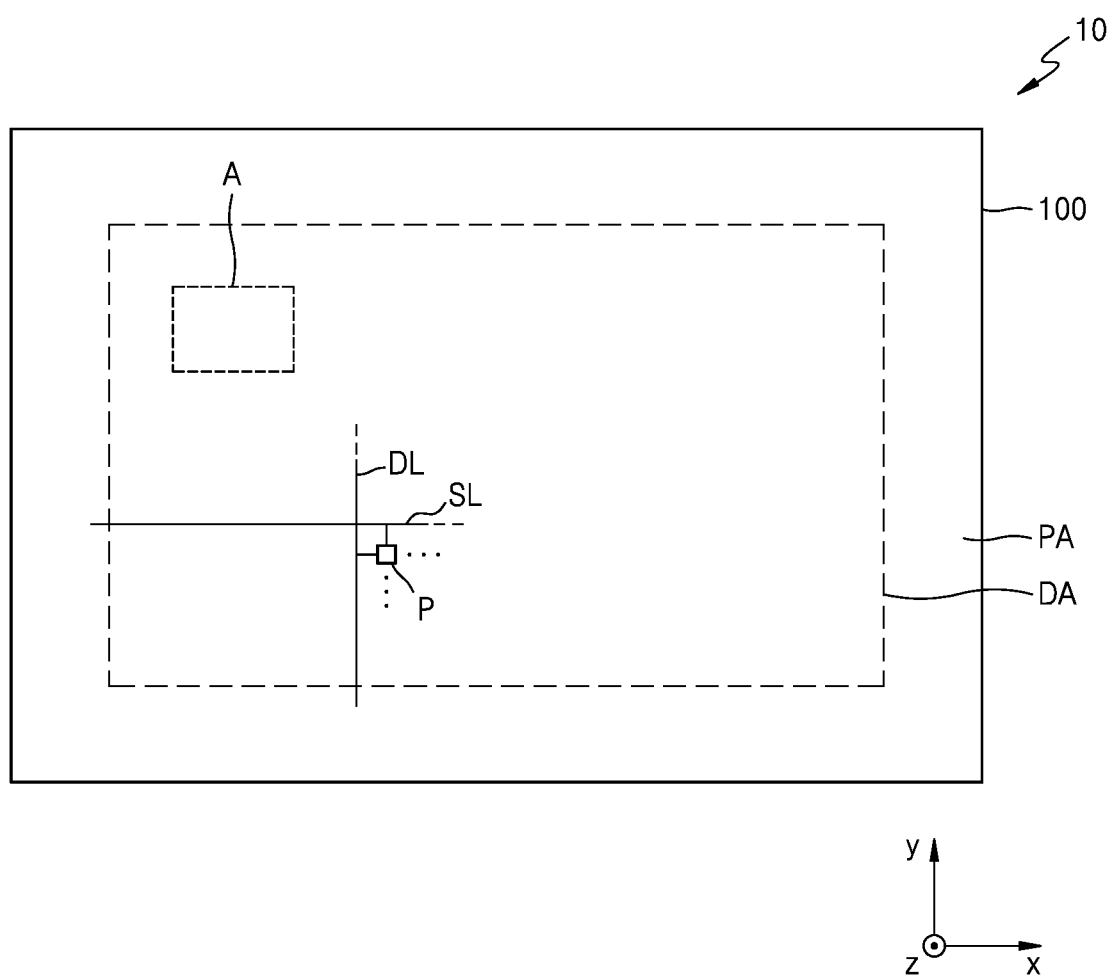
FIG. 6 is a plan view of a display panel of the display device of FIG. 3.

FIG. 6 is a schematic plan view illustrating a display panel 10 according to an embodiment.

Referring to FIG. 6, the display panel 10 may include a substrate 100 and a multilayer film on the substrate 100. A display area DA and a peripheral area PA may be defined in the substrate 100 and/or the multilayer film. For example, the substrate 100 may include a display area DA and a peripheral area PA. Hereinafter, a case in which the display area DA and the peripheral area PA are defined in the substrate 100 will be described in detail.

A sub-pixel P may be located in the display area DA, and a plurality of sub-pixels P may display an image. Each of the plurality of sub-pixels P may be connected to a scan line SL extending in a first direction (e.g., a positive x-axis direction or a negative x-axis direction) and a data line DL extending in a second direction (e.g., a positive y-axis direction or a negative y-axis direction).

The peripheral area PA may be located outside the display area DA. The peripheral area PA may at least partially surround the display area DA. In an embodiment, the peripheral area PA may entirely surround the display area DA. A scan driver for supplying a scan signal to each sub-pixel P may be located in the peripheral area PA. A data driver for supplying a data signal to the sub-pixel P may be located in the peripheral area PA. The peripheral area PA may include a pad area. In an embodiment, a pad may be located in the pad area. The pad may be exposed without being covered by an insulating layer, and may be electrically connected to a printed circuit board or a driver integrated circuit (IC). Signals and/or voltages received from the printed circuit board or the driver IC through the pad may be transmitted to the sub-pixel P located in the display area DA through a wiring line connected to the pad.

Figure 7A:
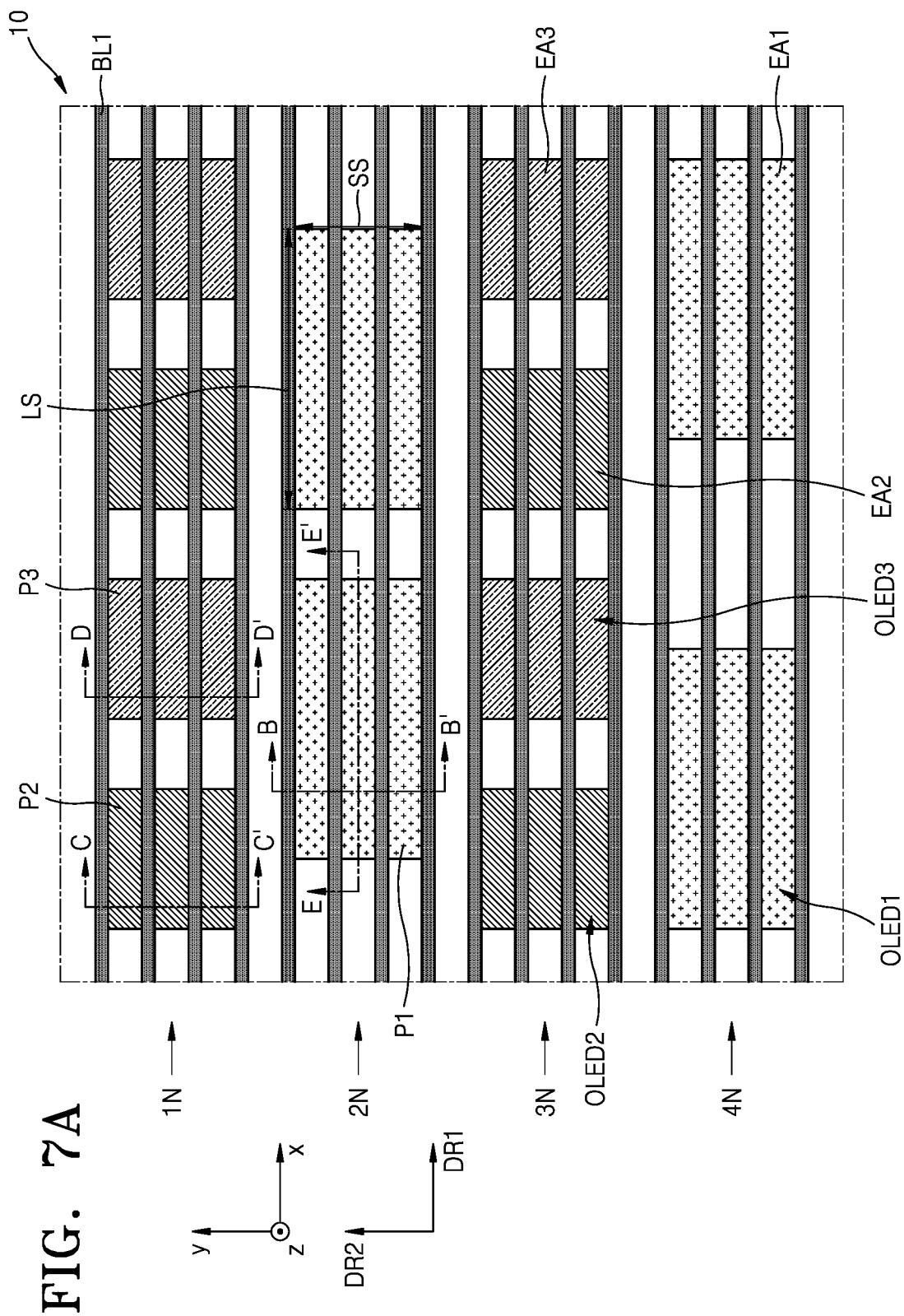
FIG. 7A is an enlarged view of a display area of the display panel illustrating an embodiment of the display panel of FIG. 6.

FIG. 7A is an enlarged view of a display area DA of a display panel according to an embodiment. FIG. 7A is an enlarged view of part A of the display panel 10 of FIG. 6.

Referring to FIG. 7A, the display panel 10 may include a first sub-pixel P1, a second sub-pixel P2, a third sub-pixel P3, and a first light-blocking line BL1.

The first sub-pixel P1 may have a long side LS extending in a first direction DR1 and a short side SS extending in a second direction DR2. The long side LS may be longer than the short side SS. The long side LS and the short side SS may be edges of the first sub-pixel P1. In an embodiment, the first sub-pixel P1 may have a rectangular shape. In another embodiment, the first sub-pixel P1 may have a polygonal shape or a circular shape.

In an embodiment, the first direction DR1 and the second direction DR2 intersects each other. For example, the first direction DR1 and the second direction DR2 may form an acute angle, an orthogonal angle, or an obtuse angle with each other. For example, the first direction DR1 may be a positive x-axis direction or a negative x-axis direction. The second direction DR2 may be a positive y-axis direction or a negative y-axis direction. Hereinafter, a case in which the first direction DR1 and the second direction DR2 are orthogonal to each other will be described in detail.

In an embodiment, the first sub-pixel P1 may be in the form of a blue sub-pixel. The first sub-pixel P1 may emit light in a blue wavelength band.

In an embodiment, the size of the first sub-pixel P1 may be defined as the size of a first emission area EA1 of a first organic light-emitting diode OLED1 as a first display element. The first emission area EA1 may be an area in which the first organic light-emitting diode OLED1 emits light. In this case, the long side LS and the short side SS of the first sub-pixel P1 may be a long side LS and a short side SS of the first emission area EA1, respectively. The long side LS and the short side SS may be edges of the first emission area EA1.

In an embodiment, the first organic light-emitting diode OLED1 may be in the form of a blue organic light-emitting diode. The first emission area EA1 of the first organic light-emitting diode OLED1 may emit light in a blue wavelength band.

The second sub-pixel P2 may be located on one side of the long side LS of the first sub-pixel P1. The second sub-pixel P2 may be apart from the first sub-pixel P1 in the second direction DR2. In an embodiment, the second sub-pixel P2 may be apart from the first sub-pixel P1 in the positive y-axis direction or the negative y-axis direction. In an embodiment, the second sub-pixel P2 may have a square shape. In another embodiment, the second sub-pixel P2 may have a rectangular shape. In another embodiment, the second sub-pixel P2 may have a polygonal shape or a circular shape.

In an embodiment, the second sub-pixel P2 may be in the form of a green sub-pixel. The second sub-pixel P2 may emit light in a green wavelength band.

In an embodiment, the size of the second sub-pixel P2 may be defined as the size of a second emission area EA2 of a second organic light-emitting diode OLED2 as a second display element. The second emission area EA2 may be an area in which the second organic light-emitting diode OLED2 emits light.

In an embodiment, the second emission area EA2 may be located on one side of the long side LS of the first emission area EA1. The second emission area EA2 may be apart from the first emission area EA1 in the second direction DR2. In an embodiment, the second emission area EA2 may be apart from the first emission area EA1 in the positive y-axis direction or the negative y-axis direction.

In an embodiment, the second organic light-emitting diode OLED2 may be in the form of a green organic light-emitting diode. The second emission area EA2 of the second organic light-emitting diode OLED2 may emit light in a green wavelength band.

The third sub-pixel P3 may be located on one side of the long side LS of the first sub-pixel P1. In an embodiment, the third sub-pixel P3 may be apart from the first sub-pixel P1 in the second direction DR2. For example, the third sub-pixel P3 may be apart from the first sub-pixel P1 in the positive y-axis direction or the negative y-axis direction. The third sub-pixel P3 may be apart from the second sub-pixel P2. In an embodiment, the third sub-pixel P3 may be apart from the second sub-pixel P2 in the first direction DR1. For example, the third sub-pixel P3 may be apart from the second sub-pixel P2 in the positive x-axis direction or the negative x-axis direction.

In an embodiment, the third sub-pixel P3 may have a square shape. In another embodiment, the third sub-pixel P3 may have a rectangular shape. In another embodiment, the third sub-pixel P3 may have a polygonal shape or a circular shape.

In an embodiment, the third sub-pixel P3 may be in the form of a red sub-pixel. The third sub-pixel P3 may emit light in a red wavelength band.

In an embodiment, the size of the third sub-pixel P3 may be defined as the size of a third emission area EA3 of a third organic light-emitting diode OLED3 as a third display element. The third emission area EA3 may be an area in which the third organic light-emitting diode OLED3 emits light.

The third emission area EA3 may be located on one side of the long side LS of the first emission area EA1. In an embodiment, the third emission area EA3 may be apart from the first emission area EA1 in the second direction DR2. For example, the third emission area EA3 may be apart from the first emission area EA1 in the positive y-axis direction or the negative y-axis direction. The third emission area EA3 may be apart from the second emission area EA2. In an embodiment, the third emission area EA3 may be apart from the second emission area EA2 in the first direction DR1. For example, the third emission area EA3 may be apart from the second emission area EA2 in the positive x-axis direction or the negative x-axis direction.

In an embodiment, the third organic light-emitting diode OLED3 may be in the form of a red organic light-emitting diode. The third emission area EA3 of the third organic light-emitting diode OLED3 may emit light in a red wavelength band.

In an embodiment, a plurality of second sub-pixels P2 and a plurality of third sub-pixels P3 may be alternately arranged in the first direction DR1 in a first row 1N. A plurality of first sub-pixels P1 may be arranged in the first direction DR1 in a second row 2N adjacent to the first row 1N. The plurality of second sub-pixels P2 and the plurality of third sub-pixels P3 may be alternately arranged in the first direction DR1 in a third row 3N adjacent to the second row 2N. The plurality of first sub-pixels P1 may be arranged in the first direction DR1 in a fourth row 4N adjacent to the third row 3N.

In an embodiment, a separation distance between first sub-pixels P1 adjacent in the first direction DR1 in the second row 2N may be different from a separation distance between first sub-pixels P1 adjacent in the first direction DR1 in the fourth row 4N. For example, the separation distance between the first sub-pixels P1 adjacent in the first direction DR1 in the second row 2N may be less than the separation distance between the first sub-pixels P1 adjacent in the first direction DR1 in the fourth row 4N.

The arrangement of the first sub-pixel P1, the second sub-pixel P2, and the third sub-pixel P3 may be repeated in the first direction DR1 and/or the second direction DR2.

The first light-blocking line BL1 may extend in the first direction DR1. A plurality of first light-blocking lines BL1 may be provided. The plurality of first light-blocking lines BL1 may overlap the first sub-pixel P1, the second sub-pixel P2, and the third sub-pixel P3. In other words, the plurality of first light-blocking lines BL1 may overlap the first emission area EA1, the second emission area EA2, and the third emission area EA3.

The plurality of first light-blocking lines BL1 may prevent or limit light emitted from each of the first sub-pixel P1, the second sub-pixel P2, and the third sub-pixel P3 from traveling in the second direction DR2. Accordingly, the light emitted from each of the first sub-pixel P1, the second sub-pixel P2, and the third sub-pixel P3 may travel in a certain direction. For example, the light emitted from each of the first sub-pixel P1, the second sub-pixel P2, and the third sub-pixel P3 may travel in the z-axis direction. In addition, the light emitted from each of the first sub-pixel P1, the second sub-pixel P2, and the third sub-pixel P3 may have a component traveling in the first direction DR1.

In an embodiment, one of the first direction DR1 and the second direction DR2 may be substantially parallel to the imaginary straight line L (refer to FIG. 2A) connecting the side window glasses 1100 (refer to FIG. 2A) facing each other. For example, the first direction DR1 may be the positive x-axis direction or the negative x-axis direction, and a direction in which the imaginary straight line L extends may also be the positive x-axis direction or the negative x-axis direction. Accordingly, the light emitted from the display device 1 may not travel to the front window glass 1200 (refer to FIG. 2A). Alternatively, the light emitted from the display device 1 may travel to the front window glass 1200 at a relatively small intensity.

In an embodiment, the display panel 10 may be located on the center fascia 1500 described with reference to FIG. 2A. In this case, the light emitted from the display panel 10 may not travel toward the front window glass 1200, and a driver may clearly recognize an object in front without obstructing or disturbing a front view. Also, the light emitted from the display panel 10 may travel toward a driver's seat and/or a passenger seat, and the driver may recognize an image displayed on the display panel 10.

The plurality of first light-blocking lines BL1 may extend in the first direction DR1 in which the long side LS of the first sub-pixel P1 extends. Unlike in the embodiment, when the plurality of first light-blocking lines BL1 extend in the second direction DR2 in which the short side SS of the first sub-pixel P1 extends, a relatively large number of first light-blocking lines BL1 may overlap the first sub-pixel P1. In this case, a relatively large portion of the first sub-pixel P1 may overlap the first light-blocking line BL1, and the luminance of the first sub-pixel P1 may decrease. In the embodiment, the plurality of first light-blocking lines BL1 extend in the first direction DR1 in which the long side LS of the first sub-pixel P1 extends, and thus, a relatively small number of first light-blocking lines BL1 may overlap the first sub-pixel P1 and a decrease in luminance of the first sub-pixel P1 may be reduced.

When the plurality of first light-blocking lines BL1 extend in a direction intersecting the first direction DR1 and the second direction DR2 unlike in the embodiment, the light emitted from the display panel 10 may not be symmetrical in the first direction DR1. In an embodiment, as the plurality of first light-blocking lines BL1 extend in the first direction DR1, the light emitted from the display panel 10 may be symmetrical in the first direction DR1.

The plurality of first light-blocking lines BL1 may substantially equally separate or divide each of the first sub-pixel P1, the second sub-pixel P2, and the third sub-pixel P3. For example, the plurality of first light-blocking lines BL1 may substantially equally separate or divide each of the first sub-pixel P1, the second sub-pixel P2, and the third sub-pixel P3 into the same number of parts (e.g., into three parts). In an embodiment, the plurality of first light-blocking lines BL1 may substantially equally separate or divide each of the first sub-pixel P1, the second sub-pixel P2, and the third sub-pixel P3 in the second direction DR2. In other words, the plurality of first light-blocking lines BL1 may substantially equally separate or divide each of the first emission area EA1, the second emission area EA2, and the third emission area EA3. For example, the plurality of first light-blocking lines BL1 may substantially equally separate or divide each of the first emission area EA1, the second emission area EA2, and the third emission area EA3 into the same number of parts (e.g., into three parts). In an embodiment, the plurality of first light-blocking lines BL1 may substantially equally separate or divide each of the first emission area EA1, the second emission area EA2, and the third emission area EA3 in the second direction DR2. Accordingly, the light emitted from the substantially equally separated first sub-pixel P1 or first emission area EA1 may travel in a similar manner. The light emitted from the substantially equally separated or divided first sub-pixel P1 or first emission area EA1 may travel uniformly in a certain direction. Also, a moire phenomenon caused by the plurality of first light-blocking lines BL1 may be prevented or reduced.

Any one of the plurality of first light-blocking lines BL1 may overlap an edge of one of the first sub-pixel P1, the second sub-pixel P2, and the third sub-pixel P3. In an embodiment, any one of the plurality of first light-blocking lines BL1 may overlap an edge of the first sub-pixel P1. For example, any one of the plurality of first light-blocking lines BL1 may overlap the long side LS of the first sub-pixel P1. Another one of the plurality of first light-blocking lines BL1 may overlap an edge of the second sub-pixel P2. Another one of the plurality of first light-blocking lines BL1 may overlap an edge of the third sub-pixel P3. In other words, any one of the plurality of first light-blocking lines BL1 may overlap an edge of one of the first emission area EA1, the second emission area EA2, and the third emission area EA3. Accordingly, the light emitted from the outer region of the first sub-pixel P1 located at the outermost among regions of the first sub-pixel P1 separated by the plurality of first light-blocking lines BL1 may be prevented or limited from having a component in the second direction DR2. In other words, the light emitted from the outer region of the first sub-pixel P1 located at the outermost among regions of the first sub-pixel P1 may not be emitted in the second direction DR2 by the plurality of first light-blocking lines BL1.

The first light-blocking line BL1 may at least partially absorb external light or internally reflected light. The first light-blocking line BL1 may include a black pigment. The first light-blocking line BL1 may be in the form of a black matrix.

In some embodiments, in order to prevent a decrease in luminance due to the first light-blocking line BL1, the sizes of the first sub-pixel P1, the second sub-pixel P2, and the third sub-pixel P3 may be increased by the overlapping areas, over which the plurality of first light-blocking lines BL1 overlap the first sub-pixel P1, the second sub-pixel P2, and the third sub-pixel P3.

Figure 7B:
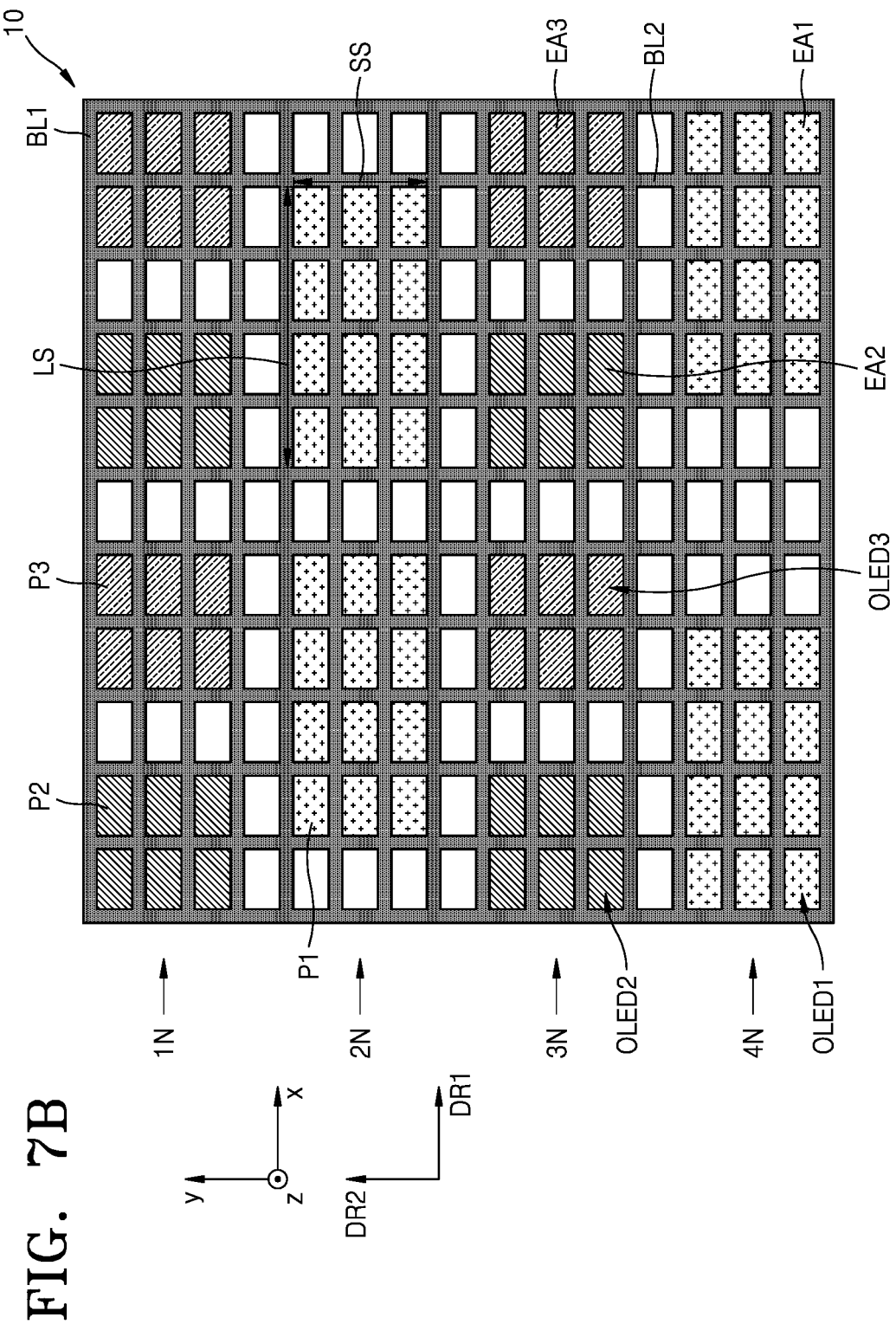
FIG. 7B is an enlarged view of a display area of the display panel illustrating another embodiment of the display panel of FIG. 6.

FIG. 7B is an enlarged view of a display area DA of a display panel 10 according to another embodiment. In FIG. 7B, the same reference numerals as those in FIG. 7A denote the same members as those in FIG. 7A, and thus redundant descriptions thereof are omitted for descriptive convenience.

Referring to FIG. 7B, the display panel 10 may include a first sub-pixel P1, a second sub-pixel P2, a third sub-pixel P3, a first light-blocking line BL1, and a second light-blocking line BL2.

The second light-blocking line BL2 may extend in a second direction DR2. A plurality of second light-blocking line BL2 may be provided. The plurality of second light-blocking lines BL2 may overlap the first sub-pixel P1, the second sub-pixel P2, and the third sub-pixel P3. In other words, the plurality of second light-blocking lines BL2 may overlap a first emission area EA1, a second emission area EA2, and a third emission area EA3.

The plurality of second light-blocking lines BL2 may prevent or limit the light emitted from each of the first sub-pixel P1, the second sub-pixel P2, and the third sub-pixel P3 from having a component in the first direction DR1. In other words, the light emitted from each of the first sub-pixel P1, the second sub-pixel P2, and the third sub-pixel P3 may not be emitted in the first direction DR1 by the plurality of second light-blocking lines BL2. In addition, the plurality of first light-blocking lines BL1 may prevent or limit the light emitted from each of the first sub-pixel P1, the second sub-pixel P2, and the third sub-pixel P3 from traveling in the second direction DR2. Accordingly, the light emitted from each of the first sub-pixel P1, the second sub-pixel P2, and the third sub-pixel P3 may travel in a certain direction. For example, the light emitted from each of the first sub-pixel P1, the second sub-pixel P2, and the third sub-pixel P3 may travel in the z-axis direction.

In an embodiment, the display panel 10 may be located in the cluster 1400 described with reference to FIG. 2B. In this case, the light emitted from the display panel 10 may not travel toward the front window glass 1200, and a driver may clearly recognize an object in front without obstructing or disturbing a front view. Also, the light emitted from the display panel 10 may not travel toward the first side window glass 1110, and the driver may clearly see the side mirror 1300.

The plurality of second light-blocking lines BL2 may substantially equally separate or divide each of the first sub-pixel P1, the second sub-pixel P2, and the third sub-pixel P3. For example, the plurality of second light-blocking lines BL2 may substantially equally separate or divide each of the first sub-pixel P1, the second sub-pixel P2, and the third sub-pixel P3 into the same number of parts (e.g., into three parts). In an embodiment, the plurality of second light-blocking lines BL2 may substantially equally separate or divide each of the first sub-pixel P1, the second sub-pixel P2, and the third sub-pixel P3 in the first direction DR1. In other words, the plurality of second light-blocking lines BL2 may substantially equally separate or divide each of the first emission area EA1, the second emission area EA2, and the third emission area EA3. For example, the plurality of second light-blocking lines BL2 may substantially equally separate or divide each of the first emission area EA1, the second emission area EA2, and the third emission area EA3 into the same number of parts (e.g., into three parts). In an embodiment, the plurality of second light-blocking lines BL2 may substantially equally separate or divide each of the first emission area EA1, the second emission area EA2, and the third emission area EA3 in the first direction DR1. Accordingly, light emitted from the substantially equally separated or divided first sub-pixel P1 or first emission area EA1 may travel in a similar manner. The light emitted from the substantially equally separated or divided first sub-pixel P1 or first emission area EA1 may travel uniformly in a certain direction. Also, a moire phenomenon caused by the plurality of second light-blocking lines BL2 may be prevented or reduced.

Any one of the plurality of second light-blocking lines BL2 may overlap an edge of one of the first sub-pixel P1, the second sub-pixel P2, and the third sub-pixel P3. In an embodiment, any one of the plurality of second light-blocking lines BL2 may overlap an edge of the first sub-pixel P1. For example, any one of the plurality of second light-blocking lines BL2 may overlap the short side SS of the first sub-pixel P1. Another one of the plurality of second light-blocking lines BL2 may overlap an edge of the second sub-pixel P2. Another one of the plurality of second light-blocking lines BL2 may overlap an edge of the third sub-pixel P3. In other words, any one of the plurality of second light-blocking lines BL2 may overlap an edge of one of the first emission area EA1, the second emission area EA2, and the third emission area EA3. Accordingly, the light emitted from the outer region of the first sub-pixel P1 located at the outermost among regions of the first sub-pixel P1 separated by the plurality of second light-blocking lines BL2 may be prevented or limited from having a component in the first direction DR1. In other words, the light emitted from the outer region of the first sub-pixel P1 located at the outermost among regions of the first sub-pixel P1 may not be emitted in the first direction DR1 by the plurality of second light-blocking lines BL2.

The second light-blocking line BL2 may at least partially absorb external light or internally reflected light. The second light-blocking line BL2 may include a black pigment. The second light-blocking line BL2 may be in the form of a black matrix.

Figure 7C:
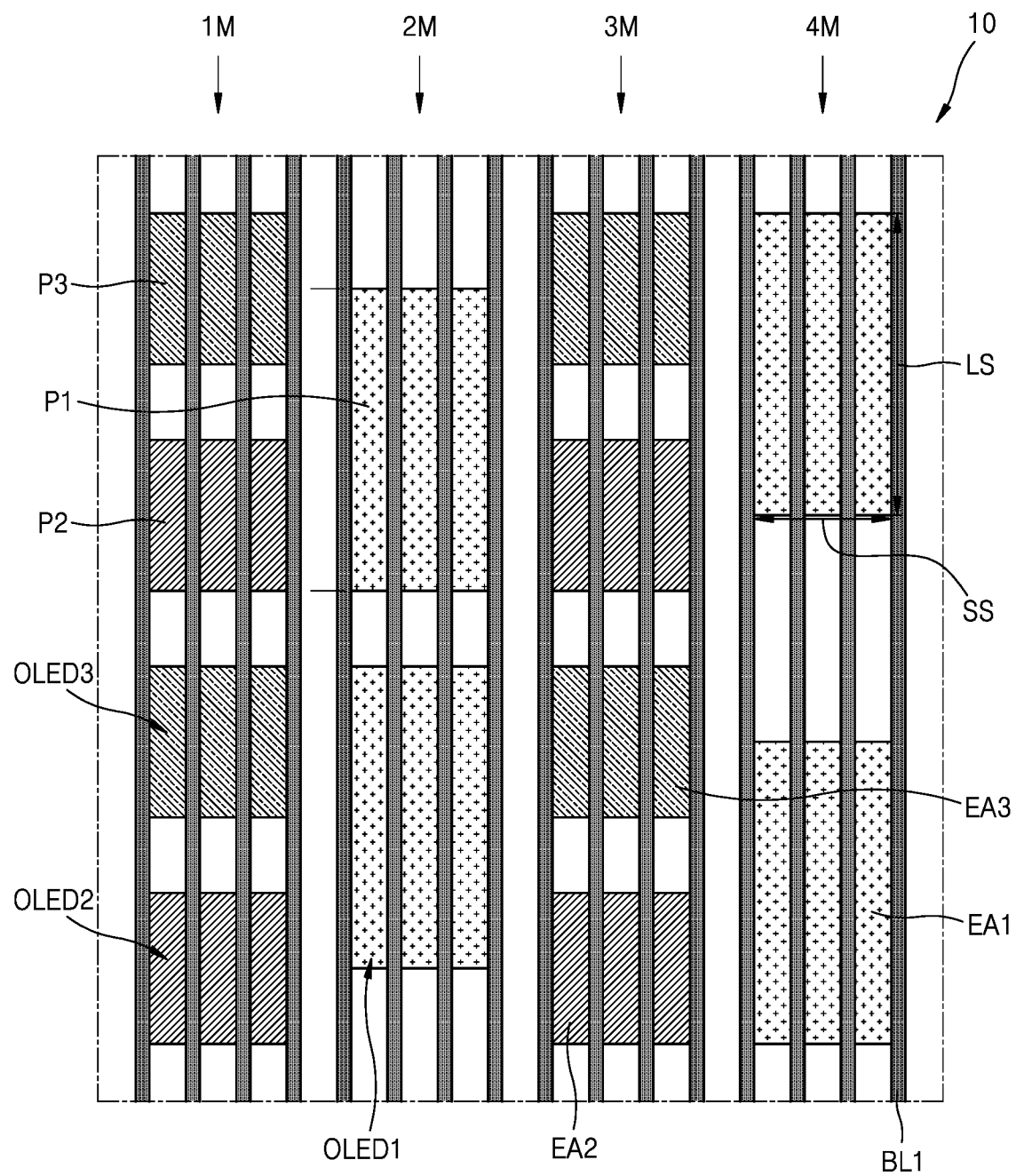
FIG. 7C is an enlarged view of a display area of the display panel illustrating another embodiment of the display panel of FIG. 6.

FIG. 7C is an enlarged view of a display area DA of a display panel 10 according to another embodiment. FIG. 7C is an enlarged view of the part A of the display panel 10 of FIG. 6 In FIG. 7C, the same reference numerals as those in FIG. 7A denote the same members as those in FIG. 7A, and thus redundant descriptions thereof are omitted for descriptive convenience.

Referring to FIG. 7C, the display panel 10 may include a first sub-pixel P1, a second sub-pixel P2, a third sub-pixel P3, and a first light-blocking line BL1.

The first sub-pixel P1 may have a long side LS extending in a first direction DR1 and a short side SS extending in a second direction DR2. The long side LS may be longer than the short side SS. The long side LS and the short side SS may be edges of the first sub-pixel P1.

In an embodiment, the first sub-pixel P1 may have a rectangular shape. In another embodiment, the first sub-pixel P1 may have a polygonal shape or a circular shape.

In an embodiment, the first direction DR1 may be a positive y-axis direction or a negative y-axis direction. The second direction DR2 may be a positive x-axis direction or a negative x-axis direction.

In an embodiment, the first sub-pixel P1 may be in the form of a blue sub-pixel. The first sub-pixel P1 may emit light in a blue wavelength band.

In an embodiment, the size of the first sub-pixel P1 may be defined as the size of a first emission area EA1 of a first organic light-emitting diode OLED1 as a first display element. The first emission area EA1 may be an area in which the first organic light-emitting diode OLED1 emits light. In this case, the long side LS and the short side SS of the first sub-pixel P1 may be a long side LS and a short side SS of the first emission area EA1, respectively. The long side LS and the short side SS may be edges of the first emission area EA1.

In an embodiment, the first organic light-emitting diode OLED1 may be in the form of a blue organic light-emitting diode. The first emission area EA1 of the first organic light-emitting diode OLED1 may emit light in a blue wavelength band.

The second sub-pixel P2 may be located on one side of the long side LS of the first sub-pixel P1. The second sub-pixel P2 may be apart from the first sub-pixel P1 in the second direction DR2. In an embodiment, the second sub-pixel P2 may be apart from the first sub-pixel P1 in the positive x-axis direction or the negative x-axis direction. In an embodiment, the second sub-pixel P2 may have a square shape. In another embodiment, the second sub-pixel P2 may have a rectangular shape. In another embodiment, the second sub-pixel P2 may have a polygonal shape or a circular shape.

In an embodiment, the second sub-pixel P2 may be in the form of a green sub-pixel. The second sub-pixel P2 may emit light in a green wavelength band.

In an embodiment, the size of the second sub-pixel P2 may be defined as the size of a second emission area EA2 of a second organic light-emitting diode OLED2 as a second display element. The second emission area EA2 may be an area in which the second organic light-emitting diode OLED2 emits light.

In an embodiment, the second emission area EA2 may be located on one side of the long side LS of the first emission area EA1. The second emission area EA2 may be apart from the first emission area EA1 in the second direction DR2. In an embodiment, the second emission area EA2 may be apart from the first emission area EA1 in the positive x-axis direction or the negative x-axis direction.

In an embodiment, the second organic light-emitting diode OLED2 may be in the form of a green organic light-emitting diode. The second emission area EA2 of the second organic light-emitting diode OLED2 may emit light in a green wavelength band.

The third sub-pixel P3 may be located on one side of the long side LS of the first sub-pixel P1. In an embodiment, the third sub-pixel P3 may be apart from the first sub-pixel P1 in the second direction DR2. For example, the third sub-pixel P3 may be apart from the first sub-pixel P1 in the positive x-axis direction or the negative x-axis direction. The third sub-pixel P3 may be apart from the second sub-pixel P2. In an embodiment, the third sub-pixel P3 may be apart from the second sub-pixel P2 in the first direction DR1. For example, the third sub-pixel P3 may be apart from the second sub-pixel P2 in the positive y-axis direction or the negative y-axis direction.

In an embodiment, the third sub-pixel P3 may have a square shape. In another embodiment, the third sub-pixel P3 may have a rectangular shape. In another embodiment, the third sub-pixel P3 may have a polygonal shape or a circular shape.

In an embodiment, the third sub-pixel P3 may be in the form of a red sub-pixel. The third sub-pixel P3 may emit light in a red wavelength band.

In an embodiment, the size of the third sub-pixel P3 may be defined as the size of a third emission area EA3 of a third organic light-emitting diode OLED3 as a third display element. The third emission area EA3 may be an area in which the third organic light-emitting diode OLED3 emits light.

The third emission area EA3 may be located on one side of the long side LS of the first emission area EA1. In an embodiment, the third emission area EA3 may be apart from the first emission area EA1 in the second direction DR2. For example, the third emission area EA3 may be apart from the first emission area EA1 in the positive x-axis direction or the negative x-axis direction. The third emission area EA3 may be apart from the second emission area EA2. In an embodiment, the third emission area EA3 may be apart from the second emission area EA2 in the first direction DR1. For example, the third emission area EA3 may be apart from the second emission area EA2 in the positive y-axis direction or the negative y-axis direction.

In an embodiment, the third organic light-emitting diode OLED3 may be in the form of a red organic light-emitting diode. The third emission area EA3 of the third organic light-emitting diode OLED3 may emit light in a red wavelength band.

In an embodiment, a plurality of second sub-pixels P2 and a plurality of third sub-pixels P3 may be alternately arranged in the first direction DR1 in a first column 1M. A plurality of first sub-pixels P1 may be arranged in the first direction DR1 in a second column 2M adjacent to the first column 1M. A plurality of second sub-pixels P2 and a plurality of third sub-pixels P3 may be alternately arranged in the first direction DR1 in a third column 3M adjacent to the second column 2M. A plurality of first sub-pixels P1 may be arranged in the first direction DR1 in the fourth column 4M adjacent to the third column 3M.

In an embodiment, a separation distance between first sub-pixels P1 adjacent in the first direction DR1 in the second column 2M may be different from a separation distance between first sub-pixel P1 adjacent in the first direction DR1 in the fourth column 4M. For example, the separation distance between the first sub-pixels P1 adjacent in the first direction DR1 in the second column 2M may be less than the separation distance between the first sub-pixel P1 adjacent in the first direction DR1 in the fourth column 4M.

The arrangement of the first sub-pixel P1, the second sub-pixel P2, and the third sub-pixel P3 may be repeated in the first direction DR1 and/or the second direction DR2.

The first light-blocking line BL1 may extend in the first direction DR1. A plurality of first light-blocking lines BL1 may be provided. The plurality of first light-blocking lines BL1 may overlap the first sub-pixel P1, the second sub-pixel P2, and the third sub-pixel P3. In other words, the plurality of first light-blocking lines BL1 may overlap the first emission area EA1, the second emission area EA2, and the third emission area EA3.

The plurality of first light-blocking lines BL1 may prevent or limit light emitted from each of the first sub-pixel P1, the second sub-pixel P2, and the third sub-pixel P3 from traveling in the second direction DR2. Accordingly, the light emitted from each of the first sub-pixel P1, the second sub-pixel P2, and the third sub-pixel P3 may travel in a certain direction. For example, the light emitted from each of the first sub-pixel P1, the second sub-pixel P2, and the third sub-pixel P3 may travel in the z-axis direction. In addition, the light emitted from each of the first sub-pixel P1, the second sub-pixel P2, and the third sub-pixel P3 may have a component traveling in the first direction DR1.

In an embodiment, one of the first direction DR1 and the second direction DR2 may be substantially parallel to the imaginary straight line L (refer to FIG. 2A) connecting the side window glasses 1100 (refer to FIG. 2A) facing each other. For example, the second direction DR1 may be the positive x-axis direction or the negative x-axis direction, and a direction, in which the imaginary straight line L, extends may also be the positive x-axis direction or the negative x-axis direction. Accordingly, the light emitted from the display device 1 may not travel to the side window glass 1100 (refer to FIG. 2A). Alternatively, the light emitted from the display device 1 may travel to the side window glass 1100 at a relatively small intensity.

In an embodiment, the display panel 10 may be located on the passenger seat dashboard 1600 described with reference to FIG. 2C. In this case, the light emitted from the display panel 10 may not travel toward the side window glass 1100, and a driver may clearly see the side mirror 1300.

The plurality of first light-blocking lines BL1 may extend in the first direction DR1 in which the long side LS of the first sub-pixel P1 extends. Accordingly, a relatively small number of first light-blocking lines BL1 may overlap the first sub-pixel P1, and a decrease in luminance of the first sub-pixel P1 may be reduced. In addition, in the embodiment, as the plurality of first light-blocking lines BL1 extend in the first direction DR1, the light emitted from the display panel 10 may be symmetrical in the first direction DR1.

The plurality of first light-blocking lines BL1 may substantially equally separate or divide each of the first sub-pixel P1, the second sub-pixel P2, and the third sub-pixel P3. For example, the plurality of first light-blocking lines BL1 may substantially equally separate or divide each of the first sub-pixel P1, the second sub-pixel P2, and the third sub-pixel P3 into the same number of parts (e.g., into three parts). In an embodiment, the plurality of first light-blocking lines BL1 may substantially equally separate or divide each of the first sub-pixel P1, the second sub-pixel P2, and the third sub-pixel P3 in the second direction DR2. Accordingly, the light emitted from the substantially equally separated first sub-pixel P1 or first emission area EA1 may travel in a similar manner. The light emitted from the substantially equally separated or divided first sub-pixel P1 or first emission area EA1 may travel uniformly in a certain direction. Also, a moire phenomenon caused by the plurality of first light-blocking lines BL1 may be prevented or reduced.

Any one of the plurality of first light-blocking lines BL1 may overlap an edge of one of the first sub-pixel P1, the second sub-pixel P2, and the third sub-pixel P3. Accordingly, the light emitted from the outer region of the first sub-pixel P1 located at the outermost among regions of the first sub-pixel P1 separated by the plurality of first light-blocking lines BL1 may be prevented or limited from having a component in the second direction DR2. In other words, the light emitted from the outer region of the first sub-pixel P1 located at the outermost among regions of the first sub-pixel P1 may not be emitted in the second direction DR2 by the plurality of first light-blocking lines BL1.

Figure 8A:
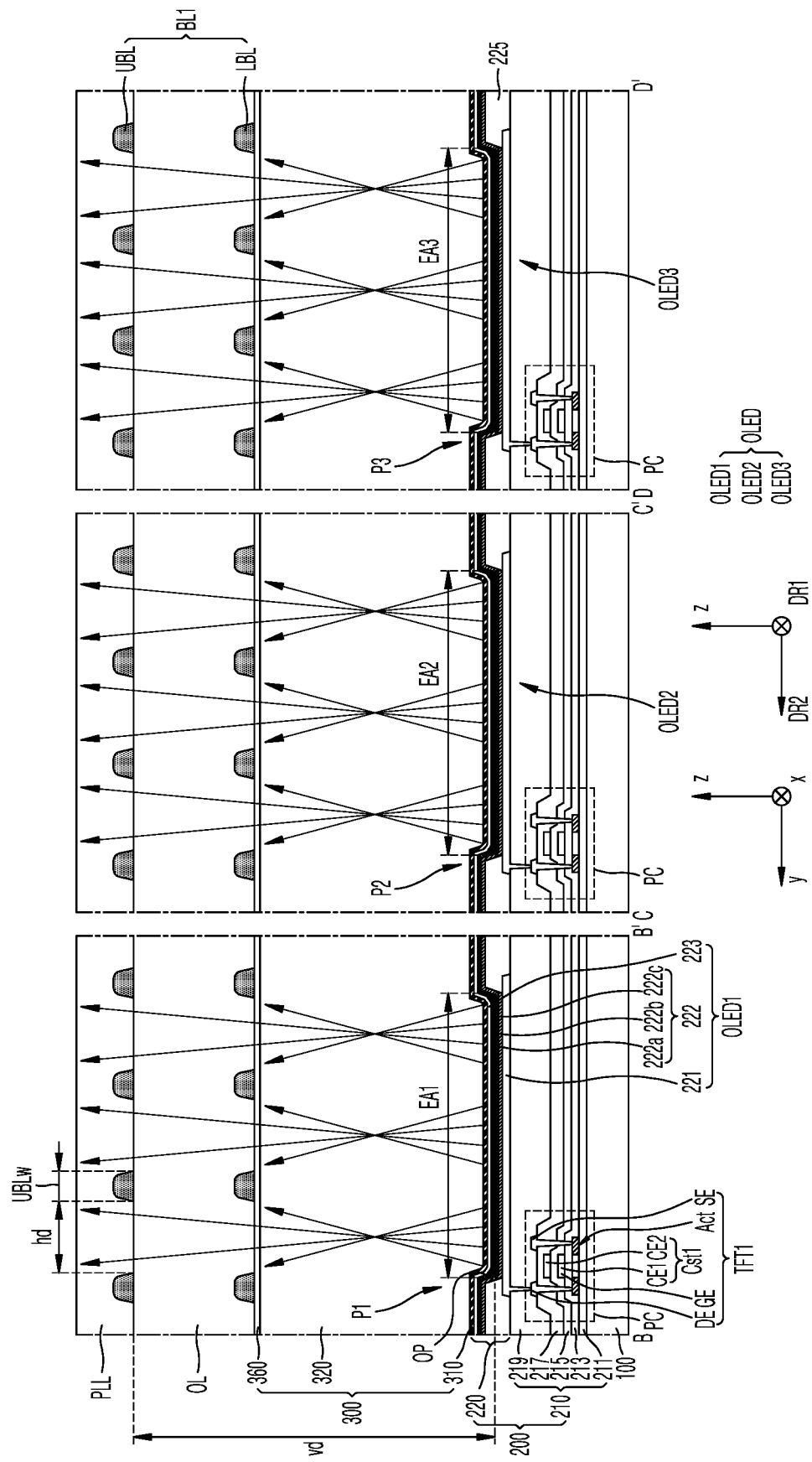
FIG. 8A is a cross-sectional view taken along lines B-B', C-C', and D-D' of FIG. 7A.
Figure 8B:
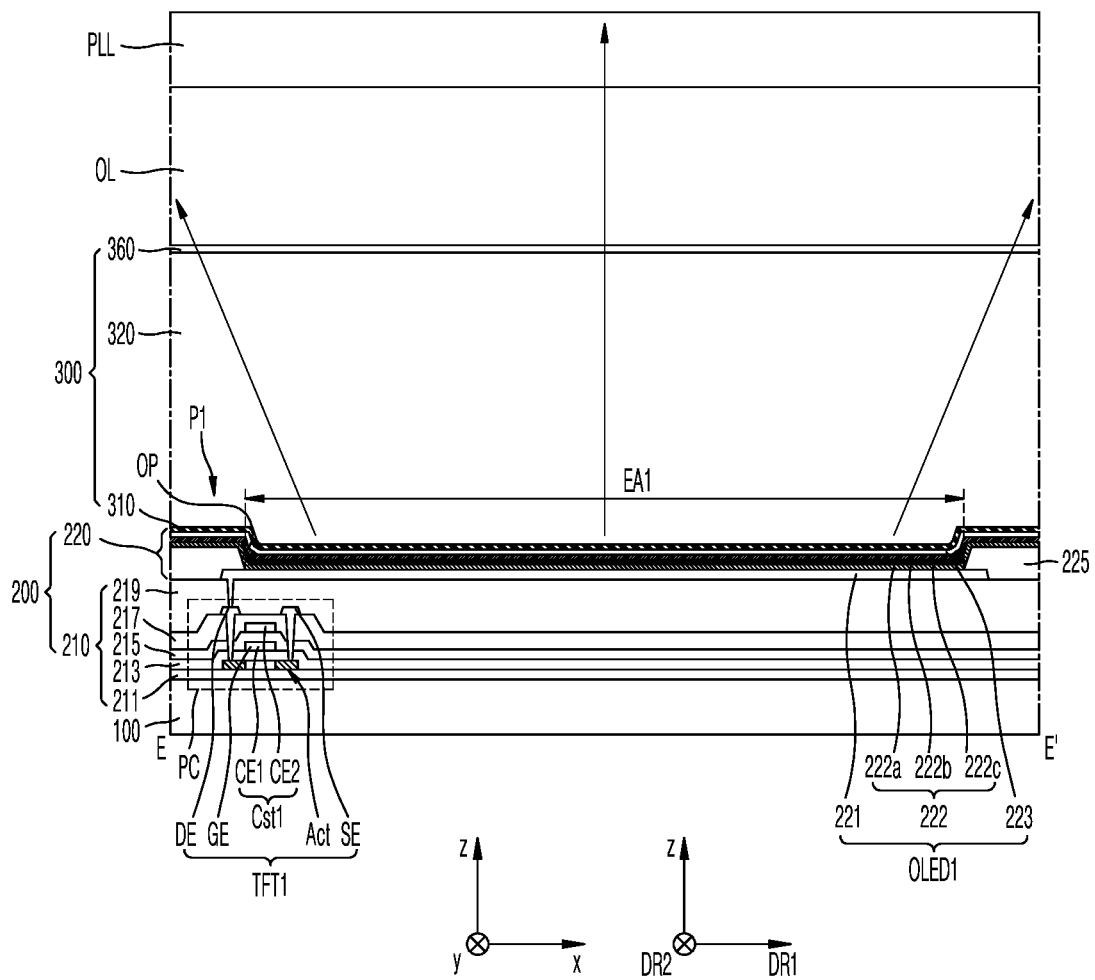
FIG. 8B is a cross-sectional view taken along line E-E' of FIG. 7A.

FIG. 8A is a schematic cross-sectional view of the display panel of FIG. 7A, taken along lines B-B', C-C', and D-D'. FIG. 8B is a schematic cross-sectional view of the display panel 10 of FIG. 7A, taken along line E-E'. In FIGS. 8A and 8B, the same reference numerals as those in FIG. 7A denote the same members as those in FIG. 7A, and thus redundant descriptions thereof are be omitted for descriptive convenience.

Referring to FIGS. 8A and 8B, the display panel 10 may include a substrate 100, a display layer 200, an encapsulation layer 300, a first light-blocking line BL1, an organic layer OL, and a planarization layer PLL.

The display layer 200 may be located on the substrate 100. The display layer 200 may include a pixel circuit layer 210 and a display element layer 220. The pixel circuit layer 210 may include a buffer layer 211, a first gate insulating layer 213, a second gate insulating layer 215, an interlayer insulating layer 217, an organic insulating layer 219, and a pixel circuit PC. The pixel circuit PC may include a thin-film transistor TFT and a storage capacitor Cst. The thin-film transistor TFT may include a semiconductor layer Act, a gate electrode GE, a source electrode SE, and a drain electrode DE.

The buffer layer 211 may be located on the substrate 100. The buffer layer 211 may include an inorganic insulating material such as SiNx, SiON, and $SiO_2$, and may include a single layer or multiple layers including the inorganic insulating material.

The thin-film transistor TFT may include a semiconductor layer Act, and the semiconductor layer Act may be located on the buffer layer 211. The semiconductor layer Act may include polysilicon. Alternatively, the semiconductor layer Act may include amorphous silicon, an oxide semiconductor, or an organic semiconductor. The semiconductor layer Act may include a channel region, a drain region, and a source region. The drain region and the source region may be respectively located on both sides of the channel region.

The gate electrode GE may overlap the channel region. The gate electrode GE may include a low-resistance metal material. The gate electrode GE may include a conductive material including molybdenum (Mo), aluminum (Al), copper (Cu), titanium (Ti), or the like, and may be formed as a single layer or multiple layers including the conductive material.

The first gate insulating layer 213 between the semiconductor layer Act and the gate electrode GE may include an inorganic insulating material such as $SiO_2$, SiNx, SiON, $Al_2O_3$, $TiO_2$, $Ta_2O_5$, $HfO_2$, or ZnO.

The second gate insulating layer 215 may be provided to cover the gate electrode GE. Similar to the first gate insulating layer 213, the second gate insulating layer 215 may include an inorganic insulating material such as $SiO_2$, SiNx, SiON, $Al_2O_3$, $TiO_2$, $Ta_2O_5$, $HfO_2$, or ZnO.

An upper electrode CE2 of the storage capacitor Cst may be located on the second gate insulating layer 215. The upper electrode CE2 may overlap the gate electrode GE thereunder. In this case, the gate electrode GE and the upper electrode CE2 overlapping each other with the second gate insulating layer 215 therebetween may provide the storage capacitor Cst. For example, the gate electrode GE may function as a lower electrode CE1 of the storage capacitor Cst.

In an embodiment, the storage capacitor Cst and the thin-film transistor TFT may be provided to overlap each other. In some embodiments, the storage capacitor Cst may be provided not to overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the aforementioned materials.

The interlayer insulating layer 217 may cover the upper electrode CE2. The interlayer insulating layer 217 may include $SiO_2$, SiNx, SiON, $Al_2O_3$, $TiO_2$, $Ta_2O_5$, $HfO_2$, ZnO, or the like. The interlayer insulating layer 217 may include a single layer or multiple layers including the aforementioned inorganic insulating material.

The drain electrode DE and the source electrode SE may each be located on the interlayer insulating layer 217. The drain electrode DE and the source electrode SE may each be electrically connected to the semiconductor layer Act. The drain electrode DE and the source electrode SE may include a material having high conductivity. The drain electrode DE and the source electrode SE may include a conductive material including Mo, Al, Cu, Ti, or the like, and may be provided as a single layer or multiple layers including the conductive material. In an embodiment, the drain electrode DE and the source electrode SE may have a multilayer structure of Ti/Al/Ti.

The organic insulating layer 219 may be located to cover the drain electrode DE and the source electrode SE. The organic insulating layer 219 may include an organic material, such as a general polymer such as polymethylmethacrylate (PMMA) or polystyrene (PS), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, and a blend thereof. In some embodiments, the organic insulating layer 219 may include a first organic insulating layer and a second organic insulating layer.

The display element layer 220 may be located on the pixel circuit layer 210. The display element layer 220 may be located on the organic insulating layer 219. The display element layer 220 may include a plurality of organic light-emitting diodes OLED as a plurality of display elements. In an embodiment, the display element layer 220 may include a first organic light-emitting diode OLED1 as a first display element, a second organic light-emitting diode OLED2 as a second display element, a third organic light-emitting diode OLED3 as a third display element, and a pixel-defining layer 225.

The first organic light-emitting diode OLED1, the second organic light-emitting diode OLED2, and the third organic light-emitting diode OLED3 may be located on the organic insulating layer 219. In an embodiment, the first organic light-emitting diode OLED1 may implement the first sub-pixel P1. The second organic light-emitting diode OLED2 may implement the second sub-pixel P2. The third organic light-emitting diode OLED3 may implement the third sub-pixel P3.

The first organic light-emitting diode OLED1, the second organic light-emitting diode OLED2, and the third organic light-emitting diode OLED3 may emit red, green, or blue light, or emit red, green, blue, or white light. Hereinafter, a case in which the first organic light-emitting diode OLED1 emits blue light, the second organic light-emitting diode OLED2 emits green light, and the third organic light-emitting diode OLED3 emits red light will be mainly described in detail. In addition, as the second organic light-emitting diode OLED2 and the third organic light-emitting diode OLED3 are similar to the first organic light-emitting diode OLED1, the first organic light-emitting diode OLED1 will be described in detail.

The first organic light-emitting diode OLED1 may include a pixel electrode 221, an intermediate layer 222, and a common electrode 223. The pixel electrode 221 may be electrically connected to the thin-film transistor TFT through a contact hole of the organic insulating layer 219. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective layer including Ag, Mg, Al, Pt, Pd, Au, Ni, Nd, Ir, Cr, or a compound thereof. In another embodiment, the pixel electrode 221 may further include a layer provided of ITO, IZO, ZnO, or $In_2O_3$ above/under the reflective layer. For example, the pixel electrode 221 may have a multilayer structure of ITO/Ag/ITO.

The pixel-defining layer 225 may cover an edge of the pixel electrode 221. The pixel-defining layer 225 may include an opening OP. The opening OP may expose a central portion of the pixel electrode 221. The opening OP may define an emission area of light emitted from the organic light-emitting diode OLED. In an embodiment, the width of the first emission area EA1 in the first direction DR1 may be greater than the width of the first emission area EA1 in the second direction DR2. In an embodiment, the pixel-defining layer 225 may include an organic material and/or an inorganic material. In an embodiment, the pixel-defining layer 225 may be transparent. In some embodiments, the pixel-defining layer 225 may include a black matrix. In this case, the pixel-defining layer 225 may be opaque.

The intermediate layer 222 may include a first functional layer 222a, an emission layer 222b, and a second functional layer 222c. The emission layer 222b may include a polymer or a low molecular weight organic material that emits light of a certain color.

In an embodiment, at least one of the first functional layer 222a and the second functional layer 222c may be a common layer located entirely in a display area. The first functional layer 222a may include, for example, a hole transport layer (HTL), or may include an HTL and a hole injection layer (HIL). The second functional layer 222c may include an electron transport layer (ETL) and/or an electron injection layer (EIL). In some embodiments, the second functional layer 222c may be omitted for descriptive convenience. [0196] The common electrode 223 may be located on the emission layer 222b. The common electrode 223 may include a conductive material having a low work function. For example, the common electrode 223 may include a transparent layer or a semi-transparent layer including Ag, Mg, Al, Pt, Pd, Au, Ni, Nd, Ir, Cr, Li, Ca, or an alloy thereof. Alternatively, the common electrode 223 may further include a layer such as ITO, IZO, ZnO, or $In_2O_3$ on the transparent layer or a semi-transparent layer including the aforementioned material.

In some embodiments, a capping layer may be further located on the common electrode 223. The capping layer may include LiF, an inorganic material, and/or an organic material.

The encapsulation layer 300 may be located on the display element layer 220. The encapsulation layer 300 may cover the first organic light-emitting diode OLED1, the second organic light-emitting diode OLED2, and the third organic light-emitting diode OLED3. In an embodiment, the encapsulation layer 300 may include at least one inorganic encapsulation layer and at least one organic encapsulation layer. FIGS. 8A and 8B illustrate that the encapsulation layer 300 includes a first inorganic encapsulation layer 310, a first organic encapsulation layer 320, and a second inorganic encapsulation layer 330, which are sequentially stacked.

The at least one inorganic encapsulation layer may include at least one inorganic material selected from among $Al_2O_3$, $TiO_2$, $Ta_2O_5$, $HfO_2$, ZnO, $SiO_2$, SiNx, and SiON. In an embodiment, the first inorganic encapsulation layer 310 may include SiON. The second inorganic encapsulation layer 330 may include SiNx.

At least one organic encapsulation layer may include a polymer-based material. The polymer-based material may include an acrylic resin, an epoxy-based resin, polyimide, polyethylene, or the like. In an embodiment, the at least one organic encapsulation layer may include an acrylate.

The organic layer OL may be located on the encapsulation layer 300. The organic layer OL may include polydiarylsiloxane, methyltrimethoxysilane, or tetramethoxysilane. In an embodiment, the organic layer OL may be formed by applying an organic material through an inkjet printing process and then curing the applied organic material. In another embodiment, the organic layer OL may be formed by an evaporation process.

In an embodiment, metal oxide particles such as ZnO, $TiO_2$, zirconium oxide ($ZrO_2$), or barium titanate ($BaTiO_3$) may be dispersed in the organic layer OL. In an embodiment, the organic layer OL may be formed by applying an organic material including metal oxide particles by an inkjet process.

The first light-blocking line BL1 may be located on the encapsulation layer 300. In an embodiment, the first light-blocking line BL1 may be located on the second inorganic encapsulation layer 330. The first light-blocking line BL1 may extend in the first direction DR1. A plurality of first light-blocking lines BL1 may be provided. The plurality of first light-blocking lines BL1 may overlap the first sub-pixel P1, the second sub-pixel P2, and the third sub-pixel P3. In other words, the plurality of first light-blocking lines BL1 may overlap the first emission area EA1, the second emission area EA2, and the third emission area EA3.

The plurality of first light-blocking lines BL1 may prevent or limit the light emitted from each of the first sub-pixel P1, the second sub-pixel P2, and the third sub-pixel P3 from traveling in the second direction DR2. Accordingly, the light emitted from each of the first sub-pixel P1, the second sub-pixel P2, and the third sub-pixel P3 may travel in a certain direction. For example, the light emitted from each of the first sub-pixel P1, the second sub-pixel P2, and the third sub-pixel P3 may travel in the z-axis direction. In addition, the light emitted from each of the first sub-pixel P1, the second sub-pixel P2, and the third sub-pixel P3 may have a component traveling in the first direction DR1.

The plurality of first light-blocking lines BL1 may substantially equally separate or divide each of the first sub-pixel P1, the second sub-pixel P2, and the third sub-pixel P3. For example, the plurality of first light-blocking lines BL1 may substantially equally separate or divide each of the first sub-pixel P1, the second sub-pixel P2, and the third sub-pixel P3 into the same number of parts (e.g., into three parts). In an embodiment, the plurality of first light-blocking lines BL1 may substantially equally separate or divide each of the first sub-pixel P1, the second sub-pixel P2, and the third sub-pixel P3 in the second direction DR2. In other words, the plurality of first light-blocking lines BL1 may substantially equally separate or divide each of the first emission area EA1, the second emission area EA2, and the third emission area EA3. For example, the plurality of first light-blocking lines BL1 may substantially equally separate or divide each of the first emission area EA1, the second emission area EA2, and the third emission area EA3 into the same number of parts (e.g., into three parts). In an embodiment, the plurality of first light-blocking lines BL1 may substantially equally separate or divide each of the first emission area EA1, the second emission area EA2, and the third emission area EA3 in the second direction DR2. Accordingly, light emitted from the substantially equally separated or divided first sub-pixel P1 or first emission area EA1 may travel in a similar manner. The light emitted from the substantially equally separated or divided first sub-pixel P1 or first emission area EA1 may travel uniformly in a certain direction. Also, a moire phenomenon caused by the plurality of first light-blocking lines BL1 may be prevented or reduced.

Any one of the plurality of first light-blocking lines BL1 may overlap an edge of one of the first sub-pixel P1, the second sub-pixel P2, and the third sub-pixel P3. In an embodiment, any one of the plurality of first light-blocking lines BL1 may overlap an edge of the first sub-pixel P1. Another one of the plurality of first light-blocking lines BL1 may overlap an edge of the second sub-pixel P2. Another one of the plurality of first light-blocking lines BL1 may overlap an edge of the third sub-pixel P3. In other words, any one of the plurality of first light-blocking lines BL1 may overlap an edge of one of the first emission area EA1, the second emission area EA2, and the third emission area EA3. Accordingly, the light emitted from the outer region of the first sub-pixel P1 located at the outermost among regions of the first sub-pixel P1 separated by the plurality of first light-blocking lines BL1 may be prevented or limited from having a component in the second direction DR2. In other words, the light emitted from the outer region of the first sub-pixel P1 located at the outermost among regions of the first sub-pixel P1 may not be emitted in the second direction DR2 by the plurality of first light-blocking lines BL1.

In an embodiment, the first light-blocking line BL1 may include a lower light-blocking line LBL and an upper light-blocking line UBL. The lower light-blocking line LBL may be located between the encapsulation layer 300 and the organic layer OL. The upper light-blocking line UBL may be located on the organic layer OL. In an embodiment, a plurality of lower light-blocking lines LBL and a plurality of upper light-blocking lines UBL may be provided, and the plurality of lower light-blocking lines LBL may overlap the plurality of upper light-blocking lines UBL, respectively. In some embodiments, one of the lower light-blocking line LBL and the upper light-blocking line UBL may be omitted for descriptive convenience.

In an embodiment, a width UBLw of the upper light-blocking line UBL in the second direction DR2 may be about 6 μm. In another embodiment, the width UBLw of the upper light-blocking line UBL in the second direction DR2 may be less than 6 μm. In another embodiment, the width UBLw of the upper light-blocking line UBL in the second direction DR2 may be greater than 6 μm.

In an embodiment, a vertical distance vd from the upper surface of the emission layer 222b to any one of the plurality of upper light-blocking lines UBL may be greater than or equal to 30 µm. Preferably, the vertical distance vd from the upper surface of the emission layer 222b to any one of the plurality of upper light-blocking lines UBL may be greater than or equal to 40 µm. The vertical distance vd may be a distance from the upper surface of the emission layer 222b to the lower surfaces of the plurality of upper light-blocking lines UBL.

In an embodiment, a horizontal distance hd between a plurality of upper light-blocking lines UBL adjacent to each other may be about 15.5 µm. In another embodiment, the horizontal distance hd between the plurality of upper light-blocking lines UBL adjacent to each other may be less than about 15.5 µm. In another embodiment, the horizontal distance hd between the plurality of upper light-blocking lines UBL adjacent to each other may be greater than about 15.5 µm. The horizontal distance hd between the plurality of upper light-blocking lines UBL adjacent to each other may be defined as a minimum distance between a plurality of upper light-blocking lines UBL adjacent to each other in the second direction DR2.

In an embodiment, the vertical distance vd from the upper surface of the emission layer 222b to any one of the plurality of upper light-blocking lines UBL may be greater than or equal to twice of the horizontal distance hd between the plurality of upper light-blocking lines UBL adjacent to each other. In this case, the light traveling in a direction inclined at an angle of about 35 degrees or more from the z-axis direction may be reduced.

In an embodiment, the lower light-blocking line LBL may be formed using a photoresist. First, a photoresist layer may be formed by applying a photoresist solution by various methods such as a spin-coating, slit-coating, spraying, or dipping process. Then, at least a portion of the photoresist layer may be exposed, and at least a portion of the photoresist layer may be removed. Then, the remaining photoresist layer may be cured to form the lower light-blocking line LBL. In an embodiment, the upper light-blocking line UBL may be formed in a similar manner to the lower light-blocking line LBL.

The planarization layer PLL may be located on the organic layer OL. In an embodiment, the upper light-blocking line UBL may be located between the planarization layer PLL and the organic layer OL. The upper surface of the planarization layer PLL may be substantially flat, and may include an organic material such as acryl, benzocyclobutene (BCB), or hexamethyldisiloxane (HMDSO).

In an embodiment, the first light-blocking line BL1 may be located on the encapsulation layer 300 and may be located under the planarization layer PLL. When a film layer including the first light-blocking line BL1 is separately or independently manufactured and then attached to the display panel 10, the distance between the display layer 200 and the first light-blocking line BL1 may be relatively larger. In this case, when a user views an image displayed on the display panel 10, the image may be formed as a double image. In an embodiment, as the first light-blocking line BL1 is located relatively closer to the display layer 200, a double image may not be formed, and a user may see a clear image.

Figure 9:
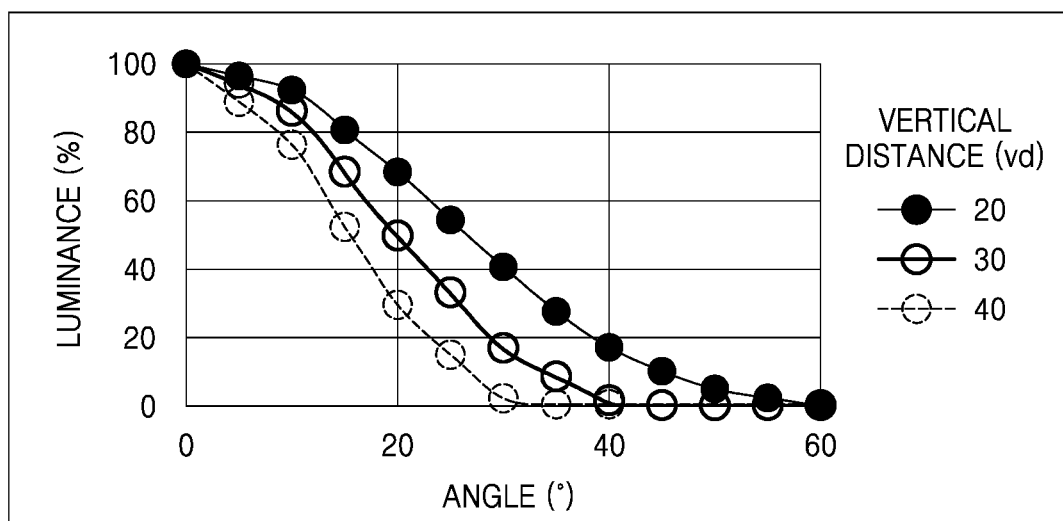
FIG. 9 is a graph showing changes in luminance according to an angle.

FIG. 9 is a graph showing a change in luminance according to an angle. For example, the luminance may be luminance of the first sub-pixel P1, the second sub-pixel P2, or the third sub-pixel P3. For example, the angle may be a view angle of a user.

Referring to FIG. 9, as the angle increases, the luminance may decrease. In this case, the angle may be an angle between the z-axis direction of FIG. 8A and a direction intersecting the z-axis direction. The vertical distance vd in FIG. 9 may be a distance from the upper surface of the emission layer 222b of FIG. 8A to the lower surfaces of the plurality of upper light-blocking lines UBL. In this case, it may be seen that, when the vertical distance vd is greater than or equal to 40 µm, a luminance value is minimized at an angle of 35 degrees or more. In particular, it may be seen that, when the width UBLw of the upper light-blocking line UBL is about 6 µm, the horizontal distance hd between the plurality of upper light-blocking lines UBL adjacent to each other is about 15.5 µm, and the vertical distance vd from the upper surface of the emission layer 222b to any one of the plurality of upper light-blocking lines UBL is greater than about 40 µm, the luminance value is minimized at an angle of 35 degrees or more.

As described above, a display panel according to embodiments may include a light-blocking line overlapping a first emission area or a first sub-pixel, which has a long side extending in a first direction and a short side extending in a second direction intersecting the first direction. Accordingly, the light emitted from the display panel may travel in a certain direction.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
   a substrate;
   a display element layer disposed on the substrate and comprising a first organic light-emitting diode having a first emission area, a second organic light-emitting diode having a second emission area, and a third organic light-emitting diode having a third emission area, the first emission area having a long side extending in a first direction and a short side extending in a second direction intersecting the first direction;
   an encapsulation layer disposed on the display element layer, the encapsulation layer comprising a first inorganic encapsulation layer covering the display element layer, an organic encapsulation layer disposed on the first inorganic encapsulation layer, and a second inorganic encapsulation layer disposed on the organic encapsulation layer; and
   a plurality of first light-blocking lines disposed on the second inorganic encapsulation layer and extending in the first direction, the plurality of first light-blocking lines overlapping the first emission area, the second emission area, and the third emission area.

2. The display panel of claim 1, wherein the plurality of first light-blocking lines divide each of the first emission area, the second emission area, and the third emission area in a same number of parts.

3. The display panel of claim 1, wherein at least one of the plurality of first light-blocking lines overlaps an edge of one of the first emission area, the second emission area, and the third emission area.

4. The display panel of claim 1, wherein each of the second emission area and the third emission area is disposed to be adjacent to the long side of the first emission area in the second direction, and
   the second emission area and the third emission area are spaced apart from each other in the first direction.

5. The display panel of claim 1, further comprising an organic layer disposed on the encapsulation layer,
wherein the plurality of first light-blocking lines comprise a plurality of lower light-blocking lines disposed between the encapsulation layer and the organic layer, and a plurality of upper light-blocking lines disposed on the organic layer and overlapping the plurality of lower light-blocking lines, respectively.

6. The display panel of claim 5, wherein the first organic light-emitting diode comprises a pixel electrode, an emission layer, and an opposite electrode,
wherein a vertical distance from an upper surface of the emission layer to one of the plurality of upper light-blocking lines is greater than or equal to about 40 μm.

7. The display panel of claim 5, wherein the first organic light-emitting diode comprises a pixel electrode, an emission layer, and an opposite electrode,
wherein a vertical distance from an upper surface of the emission layer to one of the plurality of upper light-blocking lines is greater than or equal to twice of a horizontal distance between adjacent upper light-blocking lines.

8. The display panel of claim 1, wherein the plurality of first light-blocking lines are a black matrix.

9. The display panel of claim 1, further comprising a plurality of second light-blocking lines disposed on the encapsulation layer and extending in the second direction, the plurality of second light-blocking lines overlapping the first emission area, the second emission area, and the third emission area.

10. A vehicle comprising:
side window glasses facing each other; and
a display panel disposed between the side window glasses;
wherein the display panel comprises:
a first sub-pixel having a long side extending in a first direction and a short side extending in a second direction intersecting the first direction;
a second sub-pixel disposed to be adjacent to the long side of the first sub-pixel;
a third sub-pixel disposed to be adjacent to the long side of the first sub-pixel to be spaced apart from the second sub-pixel;
an encapsulation layer disposed on the first sub-pixel, the second sub-pixel, and the third sub-pixel;
an organic layer disposed on the encapsulation layer; and
a plurality of first light-blocking lines extending in the first direction and overlapping the first sub-pixel, the second sub-pixel, and the third sub-pixel,
wherein one of the first direction and the second direction is substantially parallel to an imaginary straight line connecting the side window glasses, and
wherein the plurality of first light-blocking lines comprise a plurality of lower light-blocking lines disposed between the encapsulation layer and the organic layer, and a plurality of upper light-blocking lines disposed on the organic layer and overlapping the plurality of lower light-blocking lines, respectively.

11. The vehicle of claim 10, wherein the plurality of first light-blocking lines divide each of the first sub-pixel, the second sub-pixel, and the third sub-pixel into a same number of parts.

12. The vehicle of claim 10, wherein one of the plurality of first light-blocking lines overlaps an edge of one of the first sub-pixel, the second sub-pixel, and the third sub-pixel.

13. The vehicle of claim 10, wherein the plurality of first light-blocking lines are a black matrix.

14. The vehicle of claim 10, wherein the display panel further comprises a plurality of second light-blocking lines extending in the second direction and overlapping the first sub-pixel, the second sub-pixel, and the third sub-pixel.

15. The vehicle of claim 10, wherein the display panel further comprises:
a substrate; and
a display element layer disposed on the substrate and comprising a first organic light-emitting diode having a first emission area defining the first sub-pixel, a second organic light-emitting diode having a second emission area defining the second sub-pixel, and a third organic light-emitting diode having a third emission area defining the third sub-pixel.

16. The vehicle of claim 10, further comprising a front window glass disposed between the side window glasses facing each other,
wherein the display panel is disposed under the front window glass.

17. The vehicle of claim 10, further comprising:
a cluster;
a center fascia; and
a passenger seat dashboard spaced apart from the cluster by the center fascia therebetween,
wherein the display panel is disposed on at least one of the cluster, the center fascia, or the passenger seat dashboard.

18. The vehicle of claim 17, wherein the display panel is disposed on the center fascia, and
the first direction is substantially parallel to an imaginary straight line connecting the side window glasses.

19. The vehicle of claim 17, wherein the display panel is disposed on the passenger seat dashboard, and
the second direction is substantially parallel to an imaginary straight line connecting the side window glasses.

* * * * *